US010615199B2

(12) United States Patent
Hirase et al.

(10) Patent No.: US 10,615,199 B2
(45) Date of Patent: Apr. 7, 2020

(54) IMAGING DEVICE

(71) Applicant: Panasonic Intellectual Property Management Co., Ltd., Osaka (JP)

(72) Inventors: Junji Hirase, Osaka (JP); Yoshinori Takami, Toyama (JP); Yoshihiro Sato, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/417,333

(22) Filed: May 20, 2019

(65) Prior Publication Data
US 2019/0371840 A1 Dec. 5, 2019

(30) Foreign Application Priority Data

May 31, 2018 (JP) .................................. 2018-104989

(51) Int. Cl.
*H01L 27/146* (2006.01)
*H01L 27/30* (2006.01)
(Continued)

(52) U.S. Cl.
CPC .. *H01L 27/14603* (2013.01); *H01L 27/14609* (2013.01); *H01L 27/307* (2013.01); *H04N 5/379* (2018.08); *H04N 5/359* (2013.01)

(58) Field of Classification Search
CPC ............. H01L 27/14603; H01L 27/307; H01L 27/14609; H01L 27/146–14656; H04N 5/379; H04N 5/359
(Continued)

(56) References Cited

U.S. PATENT DOCUMENTS

2014/0043510 A1 2/2014 Kasuga et al.
2014/0091368 A1 4/2014 Miyagawa
(Continued)

FOREIGN PATENT DOCUMENTS

JP  2003-234496  8/2003
JP  2010-171439  8/2010
(Continued)

OTHER PUBLICATIONS

Extended European Search Report dated Jan. 27, 2020 for the related European Patent Application No. 19175022.3.

*Primary Examiner* — Yogesh K Aggarwal
(74) *Attorney, Agent, or Firm* — McDermott Will & Emery LLP

(57) ABSTRACT

An imaging device according to the present disclosure includes: a photoelectric converter that generates signal charge; a semiconductor substrate including a first semiconductor layer containing an impurity of a first conductivity type and an impurity of a second conductivity type; and a first transistor including a first impurity region of the second conductivity type in the first semiconductor layer. The first semiconductor layer includes: a charge accumulation region of the second conductivity type, for accumulating the signal charge; and a blocking structure between the charge accumulation region and the first transistor. The blocking structure includes a second impurity region of the first conductivity type, a third impurity region of the second conductivity type, and a fourth impurity region of the first conductivity type, which are arranged in that order in a direction from the first impurity region toward the charge accumulation region, at the surface of the first semiconductor layer.

16 Claims, 30 Drawing Sheets

(51) Int. Cl.
*H04N 5/369* (2011.01)
*H04N 5/359* (2011.01)

(58) Field of Classification Search
USPC .................................................. 348/294–324
See application file for complete search history.

(56) References Cited

U.S. PATENT DOCUMENTS

| | | |
|---|---|---|
| 2015/0069508 A1* | 3/2015 | Ko ...................... H01L 29/7816 |
| | | 257/343 |
| 2015/0109503 A1 | 4/2015 | Mori et al. |
| 2015/0123180 A1 | 5/2015 | Sato et al. |
| 2016/0079297 A1 | 3/2016 | Sato et al. |
| 2016/0173798 A1* | 6/2016 | Hirayama ......... H01L 27/14605 |
| | | 348/311 |
| 2016/0190188 A1 | 6/2016 | Murakami et al. |
| 2017/0250216 A1 | 8/2017 | Sato et al. |
| 2018/0166591 A1* | 6/2018 | Shoyama .......... H01L 21/02381 |

FOREIGN PATENT DOCUMENTS

| | | |
|---|---|---|
| JP | 2016-127265 | 7/2016 |
| JP | 2017-046333 | 3/2017 |
| JP | 2017-152669 | 8/2017 |
| WO | 2012/147302 | 11/2012 |
| WO | 2012/176454 | 12/2012 |
| WO | 2014/002330 | 1/2014 |

* cited by examiner

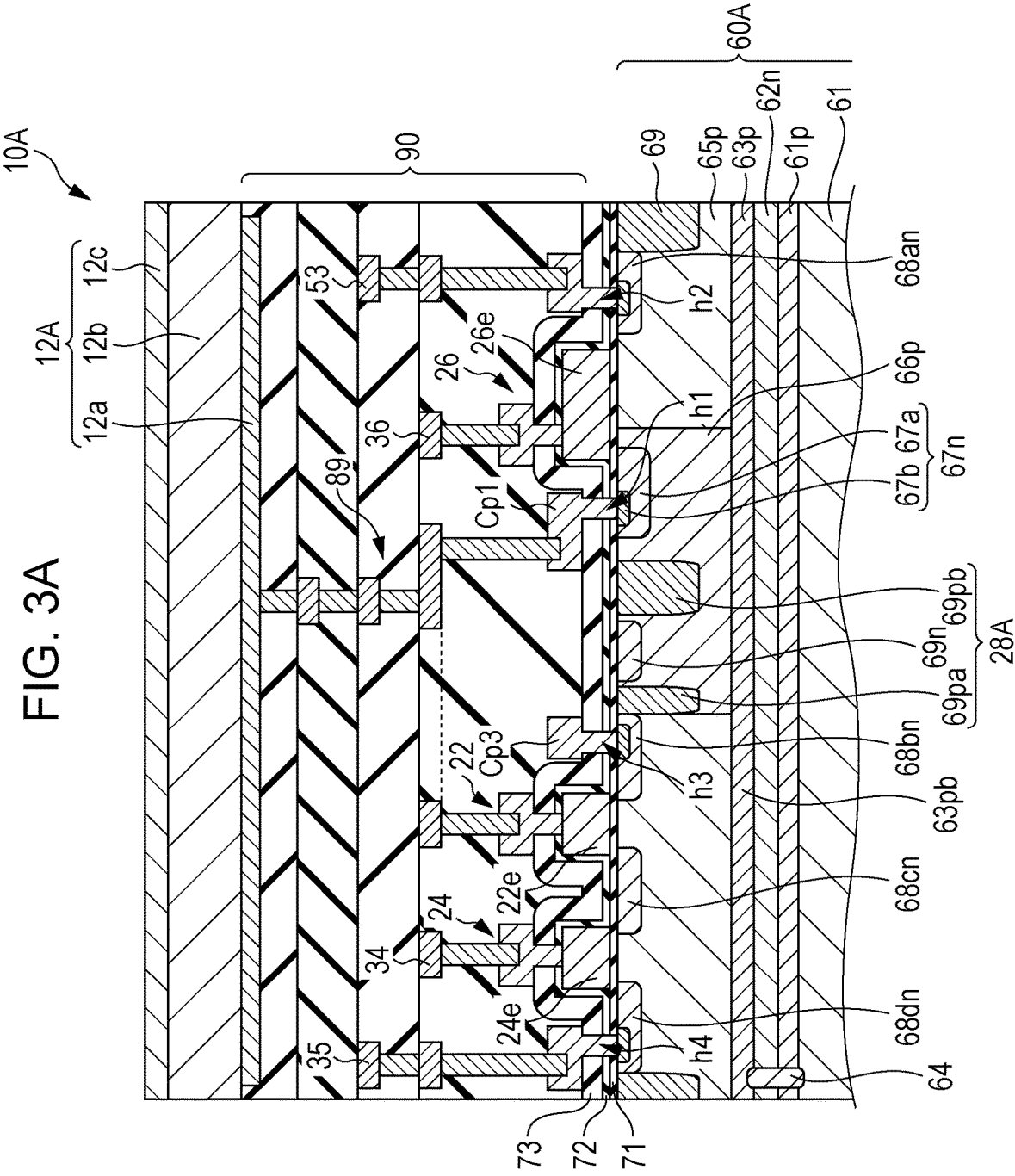

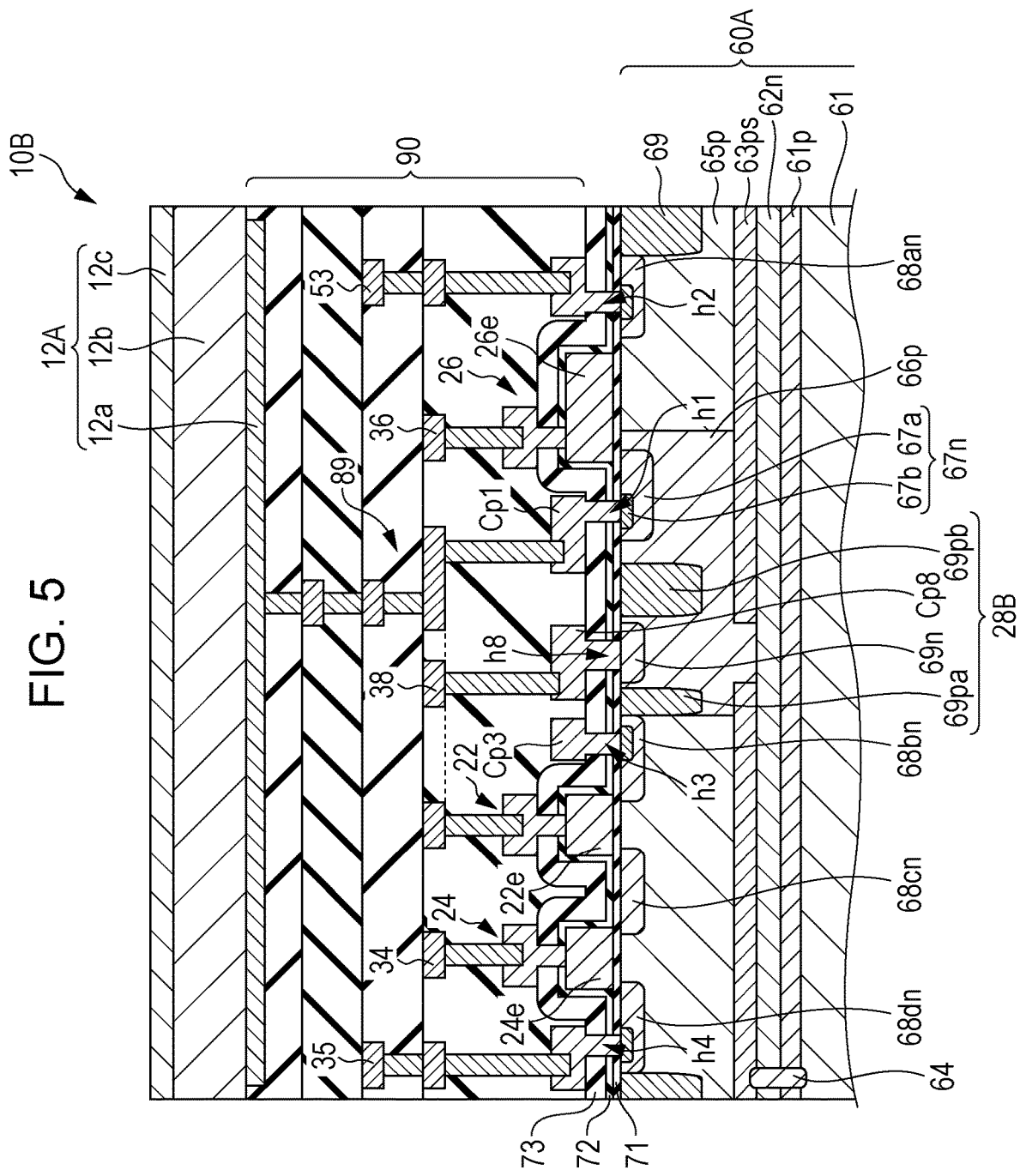

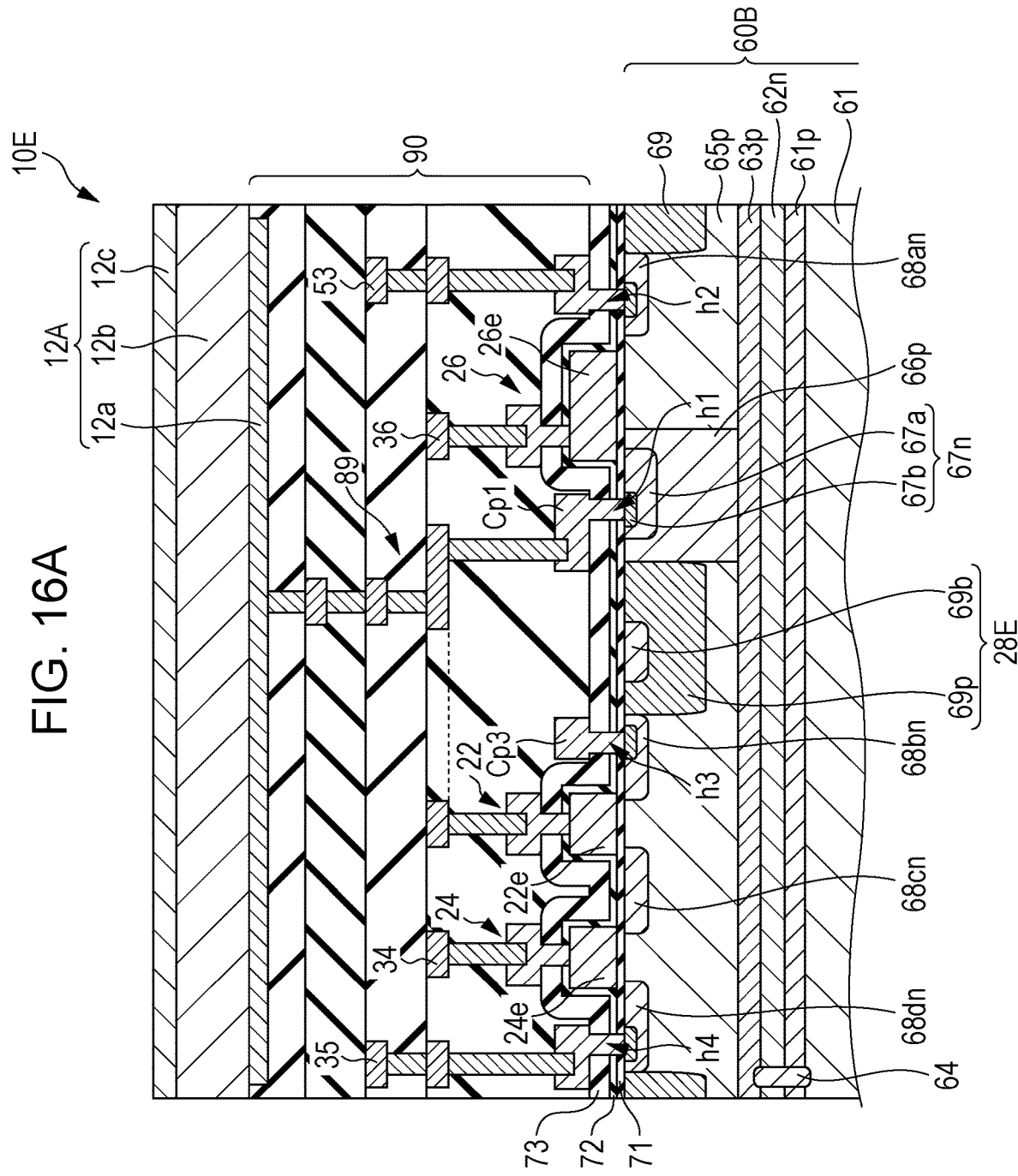

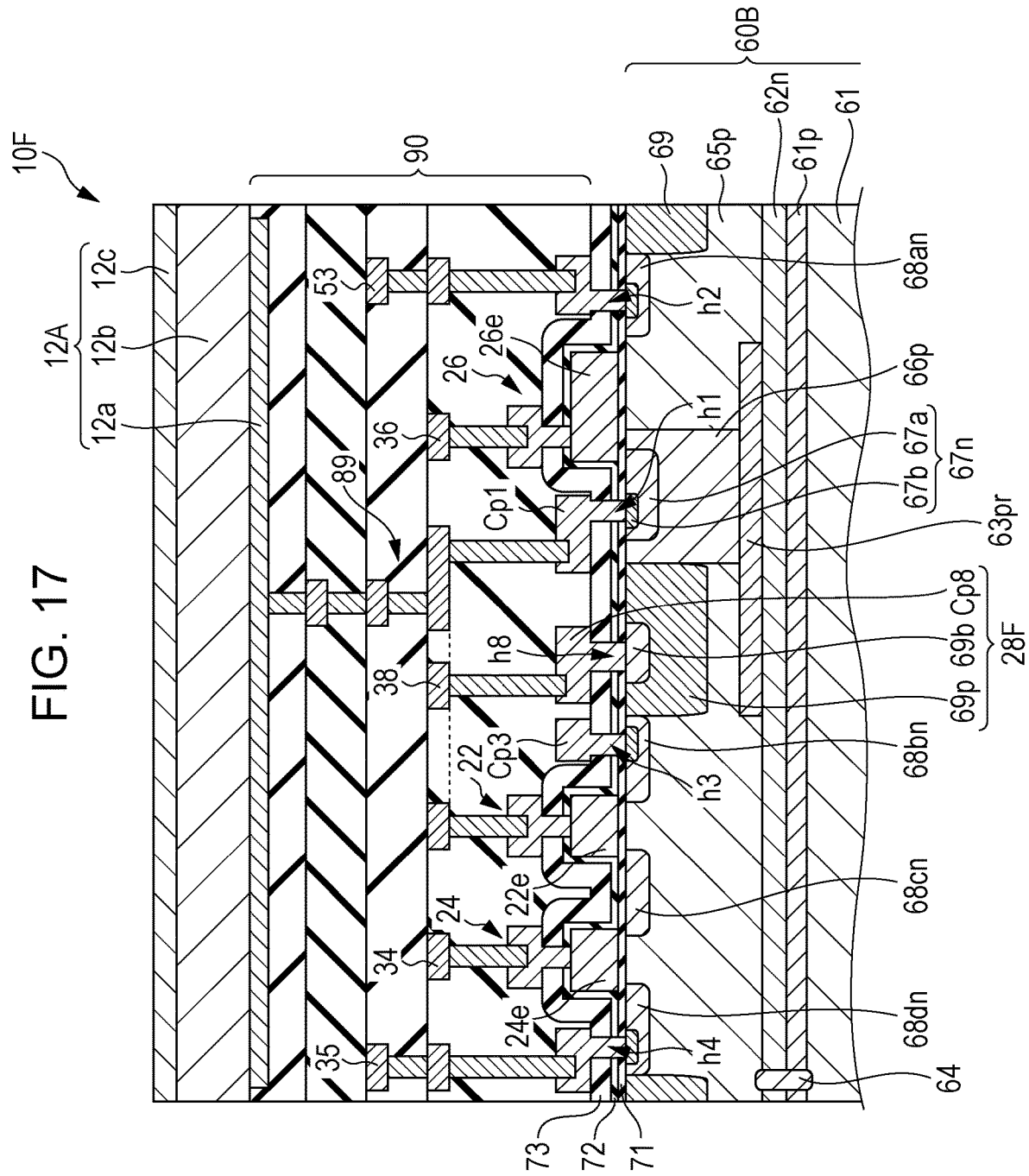

IMAGING DEVICE

BACKGROUND

1. Technical Field

The present disclosure relates to an imaging device.

2. Description of the Related Art

Charge-coupled device (CCD) image sensors and complementary metal-oxide semiconductor (CMOS) image sensors are in widespread use in digital cameras and the like. These image sensors have photodiodes formed on a semiconductor substrate, which is a well-known fact.

A structure is being proposed where a photoelectric conversion layer is disposed above the semiconductor substrate instead of the photodiodes, as disclosed in International Publication Nos. 2014/002330 and 2012/147302, for example. Imaging device that have this sort of structure may be referred to as stacked imaging devices. In a stacked imaging device, charges generated by photoelectric conversion are temporarily accumulated in diffusion regions and the like formed in the semiconductor substrate, as signal charges. Signals corresponding to the amount of charges accumulated are read out via a CCD circuit or CMOS circuit formed on the semiconductor substrate.

SUMMARY

If charges that are different from signal charges expressing an image flow into diffusion regions temporarily storing signals charges, this can lead to noise. Noise causes deterioration of the obtained image. It is advantageous to be able to suppress unintended movement of charges. Hereinafter, such unintended movement of charges may be referred to as a leak current.

One non-limiting and exemplary embodiment provides the following.

In one general aspect, the techniques disclosed here feature an imaging device, including: a photoelectric converter that generates a signal charge by photoelectric conversion of light; a semiconductor substrate that includes a first semiconductor layer containing an impurity of a first conductivity type and an impurity of a second conductivity type different from the first conductivity type; and a first transistor that includes, as a source or a drain, a first impurity region of the second conductivity type in the first semiconductor layer, wherein the first semiconductor layer includes: a charge accumulation region that is an impurity region of the second conductivity type, the charge accumulation region being configured to accumulate the signal charge; and a blocking structure that is located between the charge accumulation region and the first transistor, the blocking structure includes: a second impurity region of the first conductivity type, a third impurity region of the second conductivity type, and a fourth impurity region of the first conductivity type, and at the surface of the first semiconductor layer, the second impurity region, the third impurity region, and the fourth impurity region, are arranged in that order in a first direction from the first impurity region toward the charge accumulation region.

It should be noted that general or specific embodiments may be implemented as an element, a device, a module, system, or a method. General or specific embodiments may be implemented as any selective combination of element, device, module, system, and method.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 3A is a cross-sectional diagram schematically illustrating an example of a device structure of a first pixel illustrated in FIG. 2;

FIG. 5 is a cross-sectional diagram schematically illustrating a device structure of a pixel that an imaging device according to the second modification of the first embodiment has;

FIG. 16A is a cross-sectional view schematically illustrating an exemplary device structure of a pixel that the imaging device according to a second embodiment of the present disclosure has;

FIG. 17 is a cross-sectional view schematically illustrating the device structure of a pixel that the imaging device according to a second modification of the second embodiment of the present disclosure has;

DETAILED DESCRIPTION

Figure 1:
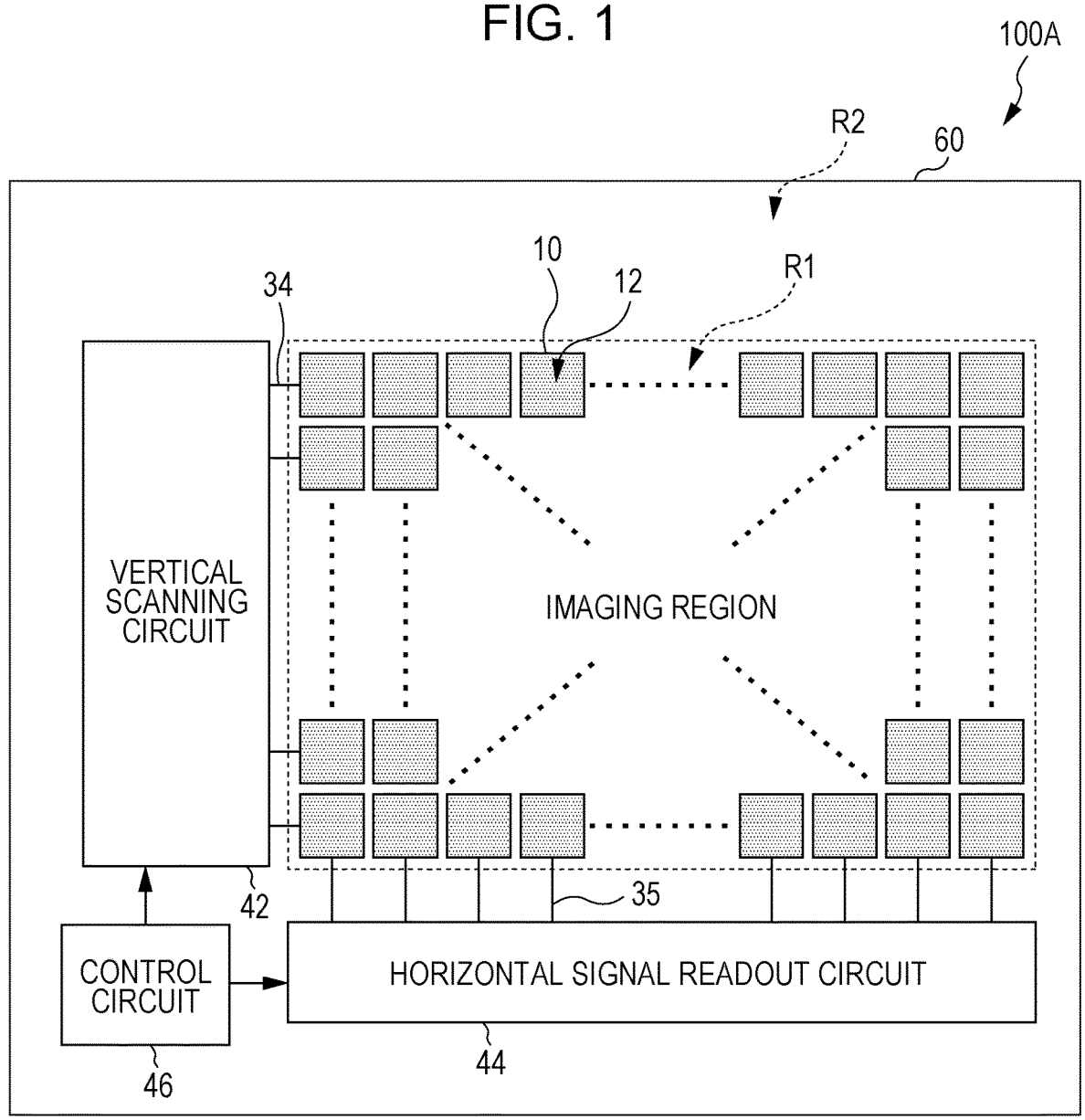
FIG. 1 is a diagram illustrating an exemplary circuit configuration of an imaging device according to a first embodiment of the present disclosure.

Aspects of the present disclosure are as described below.
Item 1
 An imaging device, including:
 a photoelectric converter that generates a signal charge by photoelectric conversion of light;
 a semiconductor substrate that includes a first semiconductor layer containing an impurity of a first conductivity type and an impurity of a second conductivity type different from the first conductivity type; and
 a first transistor that includes, as a source or a drain, a first impurity region of the second conductivity type in the first semiconductor layer, wherein
 the first semiconductor layer includes:
  a charge accumulation region that is an impurity region of the second conductivity type, the charge accumulation region being configured to accumulate the signal charge; and
  a blocking structure that is located between the charge accumulation region and the first transistor, the blocking structure includes:
 a second impurity region of the first conductivity type,
 a third impurity region of the second conductivity type, and
 a fourth impurity region of the first conductivity type, and
 at the surface of the first semiconductor layer, the second impurity region, the third impurity region, and the fourth impurity region, are arranged in that order in a first direction from the first impurity region toward the charge accumulation region.
Item 2
 The imaging device according to Item 1, wherein
 the semiconductor substrate includes
 a supporting substrate including an impurity of the first conductivity type, and
 a second semiconductor layer that is located between the supporting substrate and the first semiconductor layer, the second semiconductor layer including an impurity of the second conductivity type.
Item 3
 The imaging device according to Item 2, wherein
 the semiconductor substrate further includes a third semiconductor layer that is located between the first semiconductor layer and the second semiconductor layer, the third semiconductor layer including an impurity of the first conductivity type,
 the third semiconductor layer has an opening that overlaps the third impurity region in a plan view, and
 a concentration of impurity of the first conductivity type in a region located in the opening is lower than a concentration of impurity of the first conductivity type in the third semiconductor layer.
Item 4
 The imaging device according to any one of Items 1 through 3, further comprising a voltage supply circuit configured to apply, to the third impurity region, a first voltage that is inverse bias with regard to the first semiconductor layer, or a second voltage that is a same voltage as the first semiconductor layer, in a period in which the signal charge is accumulated in the charge accumulation region.
Item 5
 The imaging device according to Item 4, wherein a third voltage that is different from the first voltage, or the second voltage that is 0 V, is applied to the second impurity region and the fourth impurity region via the first semiconductor layer, in the period.
Item 6
 The imaging device according to Item 5, wherein the third voltage is less than the first voltage.
Item 7
 The imaging device according to any one of Items 4 through 6, wherein a same voltage is applied to the third impurity region and the second semiconductor layer in the period.
Item 8
 The imaging device according to any one of Items 1 through 7, further comprising:
 a second transistor including the charge accumulation region as one of a source and a drain, wherein
 a same voltage is applied to the third impurity region and the other of the source and the drain of the second transistor.
Item 9
 The imaging device according to any one of Items 1 through 8, wherein the second impurity region and the fourth impurity region are a single continuous impurity region surrounding the third impurity region.

Item 10
An imaging device, comprising:
a photoelectric converter that generates a signal charge by photoelectric conversion of light;
a semiconductor substrate that includes a first semiconductor layer containing an impurity of a first conductivity type and an impurity of a second conductivity type different from the first conductivity type; and
a first transistor that includes, as a source or a drain, a first impurity region of the second conductivity type in the first semiconductor layer, wherein
the first semiconductor layer includes:
a charge accumulation region that is an impurity region of the second conductivity type, the charge accumulation region being configured to accumulate the signal charge; and
a blocking structure that is located between the charge accumulation region and the first transistor, and
the blocking structure includes:
a second impurity region of the first conductivity type; and
a third impurity region of the first conductivity type, that is located in the second impurity region, a part of the third impurity region being located on the surface of the first semiconductor layer, a concentration of impurity of the first conductivity type in the third impurity region being higher than a concentration of impurity of the first conductivity type in the second impurity region.

Item 11
The imaging device according to Item 10, wherein
the semiconductor substrate includes
a supporting substrate including an impurity of the first conductivity type, and
a second semiconductor layer that is located between the supporting substrate and the first semiconductor layer, the second semiconductor layer including an impurity of the second conductivity type.

Item 12
The imaging device according to Item 11, wherein
the semiconductor substrate further includes a fourth impurity region that is located between the first semiconductor layer and the second semiconductor layer, the fourth impurity region including an impurity of the first conductivity type, and
a concentration of impurity of the first conductivity type in the fourth impurity region is higher than a concentration of impurity of the first conductivity type in the first semiconductor layer.

Item 13
The imaging device according to Item 12, wherein the fourth impurity region does not overlap the first impurity region in a plan view.

Item 14
The imaging device according to either Item 12 or 13, further comprising:
a second transistor including the charge accumulation region as one of a source and drain, wherein
the fourth impurity region does not overlap the other of the source and the drain of the second transistor in a plan view.

Item 15
The imaging device according to any one of Items 10 through 14, further comprising: a voltage supply circuit configured to apply a first voltage to the third impurity region, in a period in which the signal charge is accumulated in the charge accumulation region.

Item 16
The imaging device according to Item 15, wherein a same voltage as the first voltage is applied to the second impurity region via the supporting substrate.

Item 17
An imaging device including or more pixels, wherein each of the one or more pixels includes
a photoelectric converter,
a semiconductor substrate having a first impurity region of a second conductivity type, and a charge accumulation region of the second conductivity type that is electrically connected to the photoelectric converter,
a first transistor that has a gate electrically connected to the photoelectric converter, and that includes a first impurity region as one of a source and drain, and
a second transistor that has the charge accumulation region as one of a source and drain,
the semiconductor substrate further includes
a second impurity region and fourth impurity region of a first conductivity type disposed in the semiconductor substrate in a manner separated from each other between the first impurity region and the charge accumulation region, and
a third impurity region of the second conductivity type that is located between the second impurity region and the fourth impurity region, and
at least part of the third impurity region is located on the surface of the semiconductor substrate.

According to the configuration of Item 17, the second and fourth impurity regions of the first conductivity type are provided between the first impurity region of the second conductivity type and the charge accumulation region, and further, the third impurity region of the second conductivity type is provided between these. Accordingly, charges generated at the p-n junction of the first impurity region and moving toward the charge accumulation region can be collected by potential gradient by the third impurity region before reaching the charge accumulation region. That is to say, contamination of the charge accumulation region by excess charges can be suppressed, and deterioration of the image due to leak current can be suppressed.

Item 18
The imaging device according to Item 17, wherein
the semiconductor substrate includes
a supporting substrate including an impurity of the first conductivity type,
a first semiconductor layer that is located above the supporting substrate and that includes an impurity of the first conductivity type, and
a second semiconductor layer that is located between the supporting substrate and the first semiconductor layer, and that includes an impurity of the second conductivity type, and
the charge accumulation region, first impurity region, second impurity region, fourth impurity region, and third impurity region are located in the first semiconductor layer.

According to the configuration of Item 18, a region with relatively low concentration of impurity can be disposed in the periphery a position where a contact plug having electrical connection with the photoelectric converter is in contact with the semiconductor substrate. Accordingly, the intensity of electric field at the p-n junction formed between the charge accumulation region and the periphery thereof can be reduced, for example.

Item 19
The imaging device according to Item 18, wherein
the semiconductor substrate further includes a third semiconductor layer that is located between the first semiconductor layer and the second semiconductor layer, and that includes an impurity of the first conductivity type, the third semiconductor layer is formed at a region other than a region directly beneath the third impurity region, and the concentration of impurity of the portion located directly beneath the third impurity region in the first semiconductor layer is lower than that of the third semiconductor layer.

According to the configuration of Item 19, the position of the p-n junction formed between the second semiconductor layer and the periphery thereof bulges toward the third impurity region directly beneath the third impurity region, so the movement path of changes heading from the first impurity region toward the charge accumulation region is narrowed. Accordingly, even if charges that are generated at the p-n junction of the first impurity region and the periphery thereof and that move through the semiconductor substrate are generated, such charges advance toward the third impurity region or the second semiconductor layer following the potential gradient. As a result, movement of minority carriers to the charge accumulation region is suppressed more effectively.

Item 20

The imaging device according to either Item 18 or 19, further including:

a voltage supply circuit that applies a first voltage that is inverse bias with regard to the first semiconductor layer, or a second voltage of 0 V that is equipotential with the first semiconductor layer, to the third impurity region, in at least a period in which charges generated by the photoelectric converter are accumulated in the charge accumulation region more efficiently.

According to the configuration of Item 20, external voltage can be applied to the third impurity region, so excess charges moving toward the charge accumulation region can be recovered by the third impurity region.

Item 21

The imaging device according to Item 20, wherein the second impurity region and the fourth impurity region receive supply of a third voltage that differs from the first voltage or the second voltage of 0 V via the first semiconductor layer, in the charge accumulation period.

Item 22

The imaging device according to Item 21, wherein the third voltage is lower than the first voltage.

According to the configuration of Item 22, movement of minority carriers that are the cause of leak current to the charge accumulation region can be suppressed even more efficiently.

Item 23

The imaging device according to any one of Items 20 through 22, wherein the second semiconductor layer receives supply of voltage that is in common with the first voltage or second voltage, in the charge accumulation period.

Item 24

The imaging device according to any one of Items 17 through 23, wherein common voltage is applied to the third impurity region and the other of the source and drain of the second transistor.

According to the configuration of Item 24, the voltage supplied to the blocking structure that includes the third impurity region as a part thereof, and the reset voltage supplied to the second transistor can be made to be in common, so there is no need to provide a reset voltage source separately, which is advantageous in reduction of size of the imaging device.

Item 25

An imaging device including one or more pixels, wherein each of the one or more pixels includes a photoelectric converter, a semiconductor substrate having a first impurity region of a second conductivity type, and a charge accumulation region of the second conductivity type that is electrically connected to the photoelectric converter, a first transistor that has a gate electrically connected to the photoelectric converter, and that includes a first impurity region as one of a source and drain, and a second transistor that has the charge accumulation region as one of a source and drain, the semiconductor substrate further includes a second impurity region of a first conductivity type that is located between the first impurity region and the charge accumulation region, and a third impurity region of the first conductivity type that is located in the second impurity region, and that has a higher concentration of impurity than the second impurity region, and at least part of the third impurity region is located on the surface of the semiconductor substrate.

According to the configuration of Item 25, effects the same as Item 17 can be obtained. Further, the conductivity type is held in common between the second impurity region and the third impurity region, which reduces the number of p-n junctions in the semiconductor substrate, so effects of reducing the occurrence of charges that cause leak current can be anticipated.

Item 26

The imaging device according to Item 25, wherein the semiconductor substrate includes a supporting substrate including an impurity of the first conductivity type, a first semiconductor layer that is located above the supporting substrate and that includes an impurity of the first conductivity type, and a second semiconductor layer that is located between the supporting substrate and the first semiconductor layer, and that includes an impurity of the second conductivity type, and the charge accumulation region, the first impurity region, and the second impurity region are located in the first semiconductor layer.

According to the configuration of Item 26, effects the same as Item 18 can be obtained.

Item 27

The imaging device according to Item 26, wherein the semiconductor substrate is located on the second semiconductor layer, and further includes a fourth impurity region that includes impurity of the first conductivity type, and the concentration of impurity of the fourth impurity region is higher than that of the first semiconductor layer.

Item 28

The imaging device according to Item 27, wherein the fourth impurity region is not located directly beneath the first impurity region.

According to the configuration of Item 28, the fourth impurity region with relatively high concentration of impurity is expanded toward the first impurity region, so charges generated at the p-n junction of the first impurity region and the periphery thereof move to the fourth impurity region more readily. As a result, fewer minority carriers move from the first impurity region toward the charge accumulation region, and leak current is suppressed.

Item 29

The imaging device according to either Item 27 or 28, wherein the fourth impurity region is not located directly beneath the other of the source and drain of the second transistor.

According to the configuration of Item 29, charges generated at the p-n junction of the other of the source and drain of the second transistor and the periphery thereof move to the fourth impurity region more readily, due to the same reason as the configuration in Item 28. As a result of fewer minority carriers moving from the first impurity region toward the charge accumulation region, leak current is suppressed.

Item 30

The imaging device according to any one of Items 25 through 29, further including:

a voltage supply circuit that applies a predetermined voltage to the third impurity region, in at least a period in which signal charges generated by the photoelectric converter are accumulated in the charge accumulation region more efficiently.

According to the configuration of Item 30, external voltage can be applied to the third impurity region, so excess charges moving toward the charge accumulation region can be recovered by the third impurity region.

Item 31

The imaging device according to Item 30, wherein a voltage common with the voltage applied to the third impurity region is applied to the second impurity region in the charge accumulation period.

According to the configuration of Item 31, the potential of the second impurity region and the third impurity region is fixed in the charge accumulation period, so contamination of the charge accumulation region by minority carriers can be suppressed even more effectively.

Embodiments of the present disclosure will be described in detail below, with reference to the drawings. Note that the embodiments described below are all general or specific examples of the technology of the present disclosure. Accordingly, values, shapes, materials, components, layout and connection state of the components, steps, the order of steps, and so forth illustrated in the following embodiments, are only exemplary, and are not intended to restrict the present disclosure. Various aspects described in the present embodiment may be combined with each other to the extent that there is no conflict. Components in the following embodiments which are not included in an independent Claim indicating a highest order concept are described as optional components. Components having substantially the same functions may be denoted by common reference numerals, and description thereof omitted in the description below. Also, illustration of a part of the elements may be omitted, to avoid the drawings from becoming excessively complicated.

First Embodiment

FIG. 1 illustrates an exemplary configuration of an imaging device according to a first embodiment of the present disclosure. The imaging device 100A illustrated in FIG. 1 has multiple pixels 10 formed on a semiconductor substrate 60, and peripheral circuits.

The pixels 10 each include a photoelectric converter 12. The photoelectric converter 12 receives incident light, and generates positive and negative charges, typically a hole-electron pair. The photoelectric converter 12 may be a photoelectric conversion structure including a photoelectric conversion layer disposed above the semiconductor substrate 60, and may be a photodiode formed on the semiconductor substrate 60. Although the photoelectric converters 12 of the pixels 10 are illustrated in FIG. 1 as being spatially separated from each other, but this is only for convenience in describing, and the photoelectric converters 12 of the multiple pixel 10 may be continuously laid out on the semiconductor substrate 60 without spacing therebetween.

In the example illustrated in FIG. 1, the pixels 10 are arrayed in multiple rows and columns, of m rows and n columns. Here, m and n are independent integers of 1 or greater. A two-dimensional array, for example, of the pixels 10 on the semiconductor substrate 60, forms an imaging region R1. In a case where pixels 10 have a photoelectric conversion structure above the semiconductor substrate 60, for example, as the photoelectric converters 12, the imaging region R1 can be defined as a region of the semiconductor substrate 60 that is covered by the photoelectric conversion structure.

The number and layout of the pixels 10 is not restricted to those illustrated. For example, the number of pixels 10 included in the imaging device 100A may be one. Although the pixels 10 are arrayed with the centers thereof located on grid points of a square grid in this example, the multiple pixels 10 may be laid out such that the centers of the pixels 10 are located on grid points of a triangular grid, a hexagonal grid, or the like, for example. The imaging device 100A may be used as a line sensor by arraying the pixels 10 one-dimensionally, for example.

The peripheral circuits in the configuration exemplified in FIG. 1 include a vertical scanning circuit 42 and a horizontal signal readout circuit 44. The peripheral circuits may additionally include a control circuit 46, as exemplified in FIG. 1. The peripheral circuits may further include a voltage supply circuit that supplies a predetermined voltage to the pixels 10 and so forth, for example, which will be described later. The peripheral circuits may further include a signal processing circuit, output circuit, and so forth.

The vertical scanning circuit 42 is also referred to as a row scanning circuit, and connects to address signal lines 34 provided corresponding to each row of the multiple pixels 10. The signal line provided corresponding to each row of the multiple pixels 10 is not restricted to the address signal line 34, and multiple types of signal lines may be connected to the vertical scanning circuit 42 for each row of multiple pixels 10, which will be described later. The horizontal signal readout circuit 44 is also referred to as a column scanning circuit, and has connections with vertical signal lines 35 provided corresponding to each column of the multiple pixels 10.

The control circuit 46 receives command data, clock, and so forth, provided from the outside of the imaging device 100A for example, and controls the entire imaging device 100A. Typically, the control circuit 46 has a timing generator, and supplies drive signals to the vertical scanning circuit 42, horizontal signal readout circuit 44, later-described voltage supply circuit, and so forth. Note that the arrows extending from the control circuit 46 in FIG. 1 schematically represent the flow of output signals from the control circuit 46. The control circuit 46 may be realized by a microcontroller including one or more processor, for example. The functions of the control circuit 46 may be realized by a combination of general-purpose processing circuit and software, or may be realized by hardware specialized for such processing.

These circuits making up the peripheral circuits typically are laid out in a peripheral region R2 outside of the imaging region R1, as schematically illustrated in FIG. 1. The circuits included in the peripheral circuits are provided on the semiconductor substrate 60 in the example illustrated in FIG. 1. Note however, that part of the peripheral circuits may be provided on another substrate that is different from the semiconductor substrate 60 on which the pixels 10 are formed.

Figure 2:
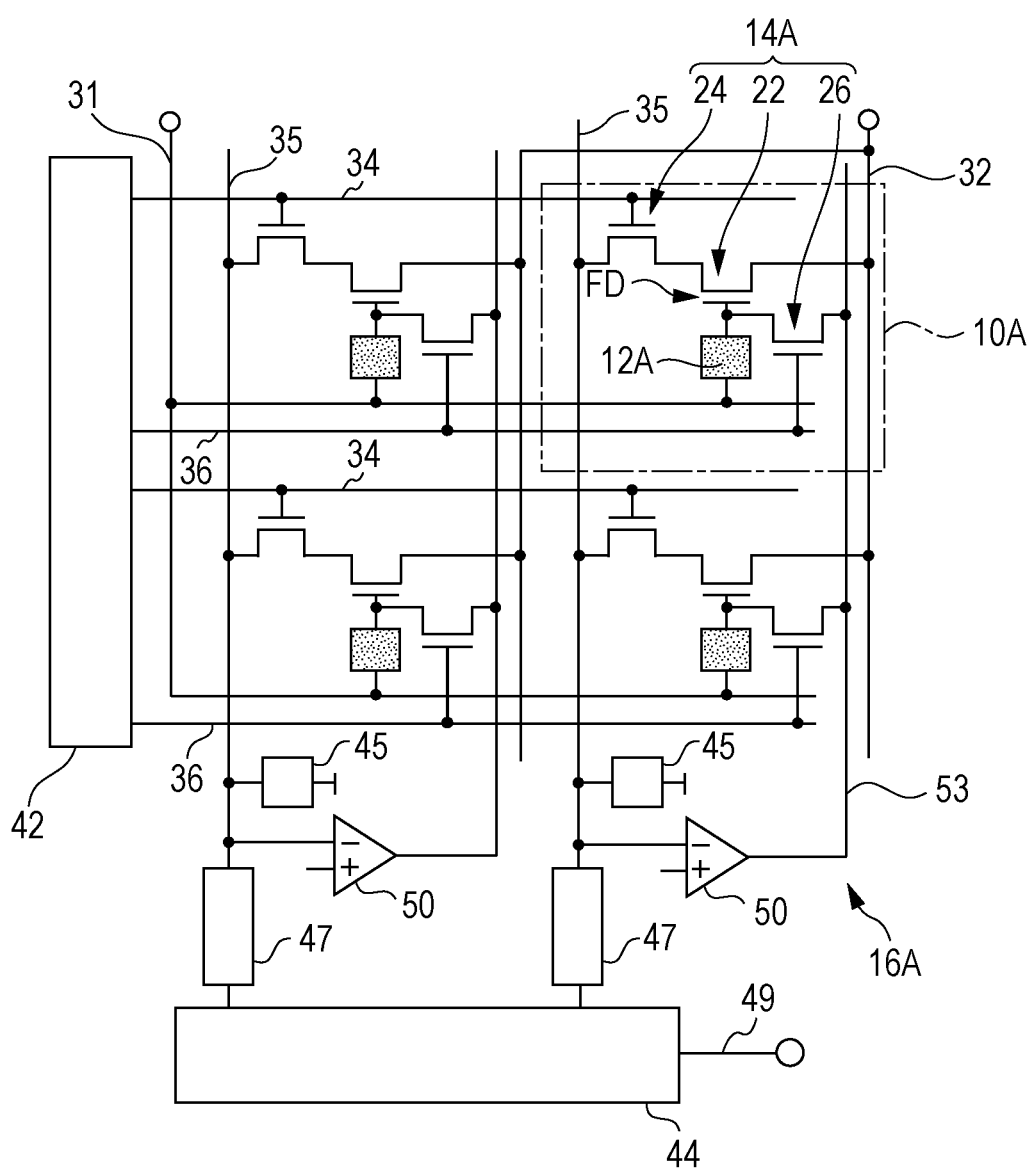
FIG. 2 is a schematic diagram illustrating an exemplary configuration of an imaging device according to the first embodiment of the present disclosure.

FIG. 2 schematically illustrates an exemplary circuit configuration of the imaging device according to the first embodiment of the present disclosure. Four pixels 10A, in a 2-row 2-column array, are representatively illustrated in FIG. 2, to avoid the drawing from becoming complicated. These pixels 10A each are an example of the pixels 10 illustrated in FIG. 1. The pixels 10A each have a photoelectric conversion structure 12A serving as the photoelectric converter 12, and include a signal detection circuit 14A electrically connected to the photoelectric conversion structure 12A. The photoelectric conversion structure 12A includes a photoelectric conversion layer disposed above the semiconductor substrate 60, which will be described later in detail with reference to the drawings. That is to say, a stacked imaging device is exemplified here as the imaging device 100A. Note that in the present specification, terms such as "above", "below", "upper face", and "lower face", are used only to specify the relative positions among parts, and do not restrict the attitude of the imaging device when in use.

The photoelectric conversion structures 12A of the pixels 10A have connection with an accumulation control line 31. When the imaging device 100A is operating, a predetermined voltage is applied to the accumulation control line 31. For example, in a case of using, of the positive and negative charges generated by photoelectric conversion, the positive charge as the signal charge, a positive voltage of around 10 V, for example, may be applied to the accumulation control line 31 when the imaging device 100A is operating. A case of using holes as signal charges will be exemplified below.

In the configuration exemplified in FIG. 2, the signal detection circuit 14A includes a signal detecting transistor 22, an address transistor 24, and a reset transistor 26. The signal detecting transistor 22, address transistor 24, and reset transistor 26 typically are field-effect transistors formed on the semiconductor substrate 60 supporting the photoelectric conversion structure 12A, which will be described later in detail with reference to the drawings. An example of using an N-channel metal-oxide semiconductor (MOS) device as the transistors will be described below, unless specifically stated otherwise.

The gate of the signal detecting transistor 22 is electrically connected to the photoelectric conversion structure 12A, as schematically illustrated in FIG. 2. In the example illustrated here, a charge accumulation node FD connecting the gate of the signal detecting transistor 22 to the photoelectric conversion structure 12A has a function of temporarily storing charges generated by the photoelectric conversion structure 12A. Applying a predetermined voltage to the accumulation control line 31 when operating enables holes, for example, to be accumulated at the charge accumulation node FD as a signal charge. The charge accumulation node FD includes an impurity region formed in the semiconductor substrate 60 as a part thereof, which will be described later with reference to the drawings.

The drain of the signal detecting transistor 22 is connected to power source wiring 32 that supplies power source voltage VDD around 3.3 V for example, to the pixels 10A when the imaging device 100A is operating. The source of the signal detecting transistor 22 is connected to the vertical signal line 35 via the address transistor 24. The signal detecting transistor 22 receives supply of the power source voltage VDD at the drain thereof, and thereby outputs signal voltage in accordance with the amount of the signal charge accumulated at the charge accumulation node FD.

The address signal line 34 is connected to the gate of the address transistor 24 connected between the signal detecting transistor 22 and the vertical signal line 35. Accordingly, the vertical scanning circuit 42 can read output of the signal detecting transistor 22 of a selected pixel 10A to the corresponding vertical signal line 35 by applying, to the address signal line 34, a row-selection signal that controls on and off of the address transistor 24. Note that the layout of the address transistor 24 is not restricted to the example illustrated in FIG. 2, and may be between the drain of the signal detecting transistor 22 and the power source wiring 32.

A load circuit 45 and column signal processing circuit 47 are connected to each vertical signal line 35. The load circuit 45 makes up a source follower circuit along with the signal detecting transistor 22. The column signal processing circuit 47 is also referred to as a row signal accumulating circuit, and performs noise suppression signal processing of which correlated double sampling is representative, analog/digital conversion, and so forth. The horizontal signal readout circuit 44 sequentially reads signals from multiple column signal processing circuits 47 to a horizontal common signal line 49. The load circuit 45 and column signal processing circuit 47 may be a part of the above-described peripheral circuits.

A reset signal line 36 that has a connection to the vertical scanning circuit 42 is connected to the gate of the reset transistor 26. A reset signal line 36 is provided to each row of multiple pixel 10A in the same way as the address signal line 34. The vertical scanning circuit 42 can select pixels 10A to be the object of resetting, in increments of rows, by applying row selection signals to the address signal line 34. The vertical scanning circuit 42 can switch the reset transistors 26 of the selected row on and off by applying a reset signal to the gate of the reset transistor 26 via the reset signal line 36. The potential of the charge accumulation node FD is reset by the reset transistor 26 going on.

In this example, one of the drain and source of the reset transistor 26 is connected to the charge accumulation node FD, and the other of the drain and source is connected to a corresponding one of feedback lines 53 provided to each row of the multiple pixels 10A. That is to say, the voltage of the feedback line 53 is supplied to the charge accumulation node FD as reset voltage to initialize the charge of the photoelectric conversion structure 12A in this example.

In the configuration exemplified in FIG. 2, the imaging device 100A has a feedback circuit 16A that includes an inverting amplifier 50 in a part of its feedback path. An inverting amplifier 50 is provided to each column of the multiple pixels 10A, with the above-described feedback line 53 being connected to the output terminal of a corresponding one of the multiple inverting amplifiers 50, as illustrated in FIG. 2. The inverting amplifier 50 may be part of the above-described peripheral circuits.

An inverting input terminal of the inverting amplifier 50 is connected to the vertical signal line 35 of a corresponding column, as illustrated in FIG. 2. When the imaging device 100A is operating, reference voltage Vref that is positive voltage of 1 V or around 1 V, for example, is supplied to the non-inverting input terminal of the inverting amplifier 50. Turning the address transistor 24 and reset transistor 26 on enables a feedback path for negative feedback of the pixel 10A to be formed, and formation of the feedback path causes the voltage of the vertical signal line 35 to converge to the input reference voltage Vref to the non-inverting input terminal of the inverting amplifier 50. In other words, formation of the feedback path resets the voltage of the charge accumulation node FD, so that the voltage of the vertical signal line 35 is Vref. The voltage of an optional magnitude within the range of power source voltage to ground voltage can be used as the reference voltage Vref. Forming the feedback path enables reset noise generated by the reset transistor 26 going off to be reduced. Details of suppression of reset noise using feedback is described in International Publication No. 2012/147302. International Publication No. 2012/147302 is incorporated herein by reference in its entirely, for reference.

Device Structure of Pixel 10A

FIG. 3A schematically illustrates an example of the device structure of the pixel 10A. The pixel 10A includes a semiconductor substrate 60A, the photoelectric conversion structure 12A disposed above the semiconductor substrate 60A, and a conductive structure 89. The photoelectric conversion structure 12A is supported by an inter-layer insulating layer 90 that covers the semiconductor substrate 60A, and the conductive structure 89 is disposed in the inter-layer insulating layer 90, as illustrated in FIG. 3A. In the exemplified example, the inter-layer insulating layer 90 includes multiple insulating layers, and the conductive structure 89 includes part of each of multiple wiring layers disposed in the inter-layer insulating layer 90. The multiple wiring layers disposed in the inter-layer insulating layer 90 may include a wiring layer that includes the address signal line 34 and reset signal line 36 and so forth as a part thereof, a wiring layer that includes the vertical signal line 35, power source wiring 32, and feedback line 53 and so forth as a part thereof, and so forth. It is needless to say that the number of insulating layers and number of wiring layers in the inter-layer insulating layer 90 is not restricted to this example, and is optionally settable.

The photoelectric conversion structure 12A includes a pixel electrode 12a formed on the inter-layer insulating layer 90, an opposing electrode 12c on the incident light side, and a photoelectric conversion layer 12b disposed between these electrodes. The photoelectric conversion layer 12b of the photoelectric conversion structure 12A is formed of an organic material or an inorganic material such as amorphous silicon or the like, and generates positive and negative charges by photoelectric conversion upon receiving incident light via the opposing electrode 12c. The photoelectric conversion layer 12b typically is formed continuously over multiple pixels 10A. The photoelectric conversion layer 12b may include a layer made up of an organic material and a layer made up of an inorganic material.

The opposing electrode 12c is a translucent electrode formed of a transparent conductive material such as indium tin oxide (ITO) or the like. Note that the term "translucent" as used in the present specification means that at least part of light of a wavelength that the photoelectric conversion layer 12b can absorb is transmitted, and transmission of light over the entire wavelength spectrum of visible light is not indispensable. Typically, the opposing electrode 12c is formed over multiple pixels 10A in the same way as the photoelectric conversion layer 12b. The opposing electrode 12c has a connection with the above-described accumulation control line 31, although this is omitted from illustration in FIG. 3A. When the imaging device 100A is operating, the potential of the accumulation control line 31 is controlled so that the potential of the opposing electrode 12c is higher, for example, than the potential of the pixel electrode 12a. Accordingly, positive charge of the positive and negative charges generated by the photoelectric conversion can be selectively collected by the pixel electrode 12a. The opposing electrode 12c may be formed as a single continuous layer over multiple pixels 10A. Accordingly, a predetermined potential can be applied in a batch to the opposing electrode 12c of the multiple pixels 10A.

The pixel electrode 12a is an electrode formed of metal such as aluminum, copper, or the like, a metal nitride, or polysilicon that has been imparted conductivity by being doped by an impurity, or the like. The pixel electrode 12a is electrically isolated from the pixel electrodes 12a of other pixels 10A by being spatially isolated from the pixel electrodes 12a of adjacent other pixels 10A.

The conductive structure 89 typically includes multiple lines and plugs formed of metal such as copper, tungsten, or the like, or metal compounds such as metal nitrides or metal oxides, and polysilicon plugs. One end of the conductive structure 89 is connected to the pixel electrode 12a. The pixel electrode 12a of the photoelectric conversion structure 12A and the circuits on the semiconductor substrate 60A are electrically connected to each other, by the other end of the conductive structure 89 being connected to circuit elements formed on the semiconductor substrate 60A, which will be described later.

Giving attention to the semiconductor substrate 60A now, the semiconductor substrate 60A includes a supporting substrate 61, and one or more semiconductor layers formed on the supporting substrate 61, as schematically illustrated in FIG. 3A. A p-type silicon substrate is exemplified here as the supporting substrate 61.

In the configuration exemplified illustrated in FIG. 3A, the semiconductor substrate 60A has a p-type semiconductor layer 61p on the supporting substrate 61, an n-type semiconductor layer 62n on the p-type semiconductor layer 61p, a p-type semiconductor layer 63p on the n-type semiconductor layer 62n, and a p-type semiconductor layer 65p located on the p-type semiconductor layer 63p. In this example, the p-type semiconductor layer 63p is formed generally over the entire face of the supporting substrate 61. The p-type semiconductor layer 65p that serves as a first semiconductor layer, the n-type semiconductor layer 62n that serves as a second semiconductor layer, the p-type semiconductor layer 63p that serves as a third semiconductor layer, and the p-type semiconductor layer 61p, are each typically formed by ion injection of an impurity to a semiconductor layer formed by epitaxial growth.

The concentration of the impurity at the p-type semiconductor layer 63p and the p-type semiconductor layer 65p is higher than the concentration of the impurity at the p-type semiconductor layer 61p. The concentration of the impurity at the p-type semiconductor layer 63p is higher than that of the p-type semiconductor layer 65p here. The concentration of the impurity at the p-type semiconductor layer 61p is around $10^{15}$ cm$^{-3}$ for example, and concentration of the impurity at the p-type semiconductor layer 65p is around $10^{17}$ cm$^{-3}$ for example. The concentration of the impurity at the p-type semiconductor layer 63p may be around $10^{18}$ cm$^{-3}$ for example. Note that the mutual relation of the concentrations of impurities above is only one example, and a configuration may be employed where the concentrations of impurities in the p-type semiconductor layer 63p and the p-type semiconductor layer 65p are around the same as each other. Alternatively, the concentration of the impurity at the p-type semiconductor layer 65p may be higher than the concentration of the impurity at the p-type semiconductor layer 63p.

The n-type semiconductor layer 62n is located between the p-type semiconductor layer 61p and p-type semiconductor layer 63p. An unshown well contact is connected to the n-type semiconductor layer 62n, although omitted from illustration in FIG. 3A. The well contact is provided on the outer side of the imaging region R1, and the potential of the n-type semiconductor layer 62n is controlled via the well contact when the imaging device 100A is operating. Providing the n-type semiconductor layer 62n suppresses inflow of minority carriers to the charge accumulation region where signal charges are accumulated from the supporting substrate 61 or peripheral circuits.

Further, in this example, the semiconductor substrate 60A has a p-type region 64 provided between the p-type semiconductor layer 63p and p-type supporting substrate 61, penetrating the p-type semiconductor layer 61p and *n*-type semiconductor layer 62n. The p-type region 64 has a higher concentration of impurity as compared to the p-type semiconductor layer 63p and p-type semiconductor layer 65p, and has a function of electrically connecting the p-type semiconductor layer 63p and supporting substrate 61 to each other.

The supporting substrate 61 has connection with a substrate contact omitted from illustration in FIG. 3A, provided on the outer side of the imaging region R1. When the imaging device 100A is operating, the potential of the supporting substrate 61 and p-type semiconductor layer 63p is controlled via the substrate contact. The potential of the p-type semiconductor layer 65p can also be controlled via the p-type semiconductor layer 63p when the imaging device 100A is operating, due to the p-type semiconductor layer 65p being located so as to be in contact with the p-type semiconductor layer 63p. Voltage of 0 V, for example, may be applied to the p-type semiconductor layer 65p via the substrate contact when the imaging device 100A is operating.

In the configuration exemplified in FIG. 3A, the p-type semiconductor layer 65p has a p-type impurity region 66p having a lower concentration of impurity as a part of the p-type semiconductor layer 65p, and an n-type impurity region 67n is formed in the p-type impurity region 66p. The n-type impurity region 67n is formed near the surface of the semiconductor substrate 60A, with at least part thereof being located on the surface of the semiconductor substrate 60A. The n-type impurity region 67n here includes a first region 67a, and a second region 67b that is located within the first region 67a and has a relatively higher concentration of impurity than the first region 67a. The concentration of impurity of the first region 67a is around $10^{17}$ cm$^{-3}$ for example, and the concentration of impurity of the second region 67b is around $3 \times 10^{18}$ cm$^{-3}$ for example.

An insulating layer is disposed on the principal face of the semiconductor substrate 60A, on the side toward the photoelectric conversion structure 12A. In this example, the principal face of the semiconductor substrate 60A on the side toward the photoelectric conversion structure 12A is covered by a first insulating layer 71, a second insulating layer 72, and a third insulating layer 73. The first insulating layer 71 is a thermally oxidized film of silicon, for example. The second insulating layer 72 is a silicon dioxide layer for example, and the third insulating layer 73 is a silicon nitride layer, for example. The second insulating layer 72 may have a layered structure including multiple insulating layers, and in the same way, the third insulating layer 73 may have a layered structure including multiple insulating layers.

The layered structure of the first insulating layer 71, second insulating layer 72, and third insulating layer 73 has a contact hole h1 on the second region 67b of the n-type impurity region 67n. A contact plug Cp1 that is part of the conductive structure 89 is connected to the second region 67b via the contact hole h1 in the example illustrated in FIG. 3A. Accordingly, the n-type impurity region 67n is electrically connected to the pixel electrode 12a of the photoelectric conversion structure 12A via the conductive structure 89.

The junction capacitance formed by the p-n junction between the p-type impurity region 66p serving as a p-well and the n-type impurity region 67n functions as capacitance that accumulates at least part of the signal charges. That is to say, the n-type impurity region 67n functions as a charge accumulation region temporarily storing signal charges. The conductive structure 89 and n-type impurity region 67n can also be said to make up at least part of the above-described charge accumulation node FD.

The potential of the p-type semiconductor layer 65p can be controlled via the p-type semiconductor layer 63p when the imaging device 100A is operating, by placing the p-type semiconductor layer 65p adjacent to the p-type semiconductor layer 63p, as described above. Employing this sort of structure enables a region with relatively low concentration of impurity to be disposed in the periphery of the portion where the contact plug Cp1, which has electrical contact with the photoelectric conversion structure 12A, and the semiconductor substrate 60A come into contact. That is to say, the first region 67a and p-type impurity region 66p can be disposed around the second region 67b of the n-type impurity region 67n as in this example. Disposing the first region 67a that has a relatively low concentration of impurity around the second region 67b enables the intensity of the electrical field formed by the p-n junction between the n-type impurity region 67n and p-type impurity region 66p to be reduced. Reducing the intensity of the electrical field formed by the p-n junction yields an effect of suppressing leak current due to the electrical field formed by the p-n junction.

Note that forming the second region 67b in the n-type impurity region 67n is not indispensable. Note however, that making the concentration of impurity of the second region 67b that is the contact portion with the contact plug Cp1 and semiconductor substrate 60A relatively high yields the effect of suppressing spread of the depletion layer around the portion where the contact plug Cp1 and semiconductor substrate 60A come into contact. This also enables suppression of crystal defects in the semiconductor substrate 60A at the interface of the contact plug Cp1 and semiconductor substrate 60A, in other words, unintended inflow of charges to the n-type impurity region 67n serving as the charge accumulation region and/or unintended outflow of charges from the n-type impurity region 67n, occurring due to the interface state. Also, connecting the contact plug Cp1 to the second region 67b that has a relatively high concentration of impurity yields the effect of reduced contact resistance.

The above-described signal detection circuit 14A is formed on the semiconductor substrate 60A. The signal detection circuit 14A in the pixel 10A is electrically isolated from the signal detection circuits 14A in other adjacent pixels 10A due to a pixel isolation region 69 being disposed between mutually adjacent pixels 10A. The pixel isolation region 69 is, for example, a p-type diffusion region.

In the signal detection circuit 14A, the reset transistor 26 includes the n-type impurity region 67n as one of the drain region and source region, and includes an n-type impurity region 68an as the other of the drain region and source region. The reset transistor 26 further includes a gate electrode 26e on the first insulating layer 71, with the portion of the first insulating layer 71 located between the gate electrode 26e and the semiconductor substrate 60A functioning as a gate insulating layer of the reset transistor 26. The n-type impurity region 68an is formed in the p-type semiconductor layer 65p, and is connected to a feedback line 53 via a contact hole h2.

Also, n-type impurity regions 68bn, 68cn, and 68dn are provided in the p-type semiconductor layer 65p. The n-type impurity regions 68an, 68bn, 68cn, and 68dn have a higher concentration of impurity than the first region 67a of the n-type impurity region 67n.

The signal detecting transistor 22 includes the n-type impurity region 68bn, the n-type impurity region 68cn, and a gate electrode 22e on the first insulating layer 71. The gate electrode 22e in this example is connected to a portion of the conductive structure 89 where the pixel electrode 12a and contact plug Cp1 come into contact, in the layer where the address signal line 34, reset signal line 36, and so forth are located, as schematically illustrated by the dashed line in FIG. 3A. In other words, the conductive structure 89 also has electrical connection with the gate electrode 22e.

The n-type impurity region 68bn serving as a drain region is connected to a contact plug Cp3 via a contact hole h3. The above-described power source wiring 32 serving as the source follower power source is connected to the contact plug Cp3. Note that the power source wiring 32 is omitted from illustration in FIG. 3A.

The n-type impurity region 68bn is located in the p-type semiconductor layer 65p, isolated from the n-type impurity region 67n serving as the charge accumulation region, as schematically illustrated in FIG. 3A. In this example, an impurity region 69n and p-type impurity regions 69pa and 69pb are interposed between the n-type impurity region 68bn and n-type impurity region 67n, thereby electrically isolating the n-type impurity region 68bn from the n-type impurity region 67n. Also, the p-type impurity region 66p extends to the position of the n-type impurity region 68bn, and the above-described impurity region 69n and p-type impurity regions 69pa and 69pb are disposed in the p-type impurity region 66p that has a relatively low impurity concentration in the p-type semiconductor layer 65p in this example. When viewing a cross-sectional taken perpendicular to the principal face of the semiconductor substrate 60A, the impurity regions 69pa and 69pb are disposed in the p-type impurity region 66p isolated from each other, between the n-type impurity region 68bn and the n-type impurity region 67n, as schematically illustrated in FIG. 3A. The impurity regions 69pa and 69pb are each part of the above described pixel isolation region 69, and typically are p-type diffusion regions. The concentration of impurity in the impurity regions 69pa and 69pb is in a range around $10^{18}$ cm$^{-3}$ or more to $5 \times 10^{18}$ cm$^{-3}$ or less, for example.

The n-type impurity region 69n having a different conductivity type is located between the p-type impurity regions 69pa and 69pb. The impurity region 69n is typically an n-type diffusion region. The impurity region 69n has around the same impurity concentration as the first region 67a of the n-type impurity region 67n or higher. That is to say, the impurity region 69n may have a concentration of impurity around $10^{17}$ cm$^{-3}$ or more, for example. Providing the n-type impurity region 69n and p-type impurity regions 69pa and 69pb between the n-type impurity region 68bn and n-type impurity region 67n enables charges that are generated at the p-n junction of the n-type impurity region 68bn and move toward the n-type impurity region 67n to be moved to the impurity region 69n by potential gradient, which will be described later with reference to the drawings.

At least part of the impurity region 69n is located on the surface of the semiconductor substrate 60A, as schematically illustrated in FIG. 3A. In the same way, at least part of the impurity region 69pa and at least part of the impurity region 69pb are also located on the surface of the semiconductor substrate 60A. Accordingly, the impurity region 69pa, the impurity region 69n, and the impurity region 69pb are disposed, in this order, in the direction heading from the impurity region 69pa toward the impurity region 69pb on the surface of the p-type semiconductor layer 65p. The impurity region 69pa and impurity region 69pb may be located so as to surround the impurity region 69n in plan view. In other words, no p-type region with a relatively high concentration is disposed at least below the impurity region 69n. Employing such a layout enables occurrence of leak current due to a p-n junction being formed between the p-type impurity region and n-type impurity region 69n to be avoided, as compared to a configuration where the n-type impurity region 69n is provided in a high-concentration p-type impurity region.

Note that in the configuration exemplified in FIG. 3A, part of the p-type impurity region 66p is further interposed between the impurity region 69pa and impurity region 69pb, and between the impurity region 69pb and impurity region 69n. Placing the impurity region 69pa and impurity region 69pb in the p-type impurity region 66p with a spacing from the impurity region 69n in this way enables formation of a p-n junction due to a relatively high-concentration p-type region and a relatively high-concentration n-type region coming into contact to be avoided, and occurrence of leak current can be further suppressed.

As described above, relatively high voltage of around 3.3 V is applied to the n-type impurity region 68bn functioning as a drain region of the signal detecting transistor 22 when the imaging device 100A is operating. According to studies made by the present inventors, when electrons are generated at a p-n junction formed between a drain region where high voltage is applied and the perimeter thereof, part of the electrons can flow into the charge accumulation region due to diffusion through the interface state of the element isolation region and the interface state of the surface of the silicon substrate. This sort of leak current that occurs due to excess charge flowing into the charge accumulation region can become a cause of deterioration in the obtained image.

However according to the first embodiment of the present disclosure, the impurity regions 69pa, 69pb, and 69n are interposed between the n-type impurity region 68bn and the n-type impurity region 67n serving as the charge accumulation region. Accordingly, charges generated at the p-n junction of the n-type impurity region 68bn and moving by diffusion toward the n-type impurity region 67n can be collected at the impurity region 69n before reaching the n-type impurity region 67n. That is to say, even in a case where there is occurrence of charges generated at the p-n junction of the n-type impurity region 68bn and moving toward the n-type impurity region 67n, contamination by excess charges to the n-type impurity region 67n that accumulates signal charges can be suppressed, and image deterioration due to leak current can be suppressed.

From this perspective, the impurity regions 69pa, 69pb, and 69n can be collectively referred to as a leak current blocking structure. For the sake of convenience, the structure including the impurity regions 69pa, 69pb, and 69n may be collectively referred to as "blocking structure 28A" hereinafter. Providing the blocking structure 28A in the pixel blocks movement of minority carriers to the n-type impurity region 67n by the blocking structure 28A, and as a result, the effects of suppressed leak current from contamination of the n-type impurity region 67n by minority carriers can be obtained.

The address transistor 24 is further formed on the semiconductor substrate 60A. The address transistor 24 includes the n-type impurity region 68cn, an n-type impurity region 68dn and a gate electrode 24e on the first insulating layer 71. The n-type impurity region 68cn functions as a drain region of the address transistor 24, and the n-type impurity region 68dn functions as a source region of the address transistor 24. The portion of the first insulating layer 71 that is located between the gate electrode 24e and the semiconductor substrate 60A functions as a gate insulating film of the address transistor 24. In this example, the n-type impurity region 68cn is shared between the address transistor 24 and the signal detecting transistor 22, so these transistors are electrically connected to each other. The vertical signal line 35 is connected to the n-type impurity region 68dn via a contact hole h4, as schematically illustrated in FIG. 3A.

First Modification

Figure 3B:
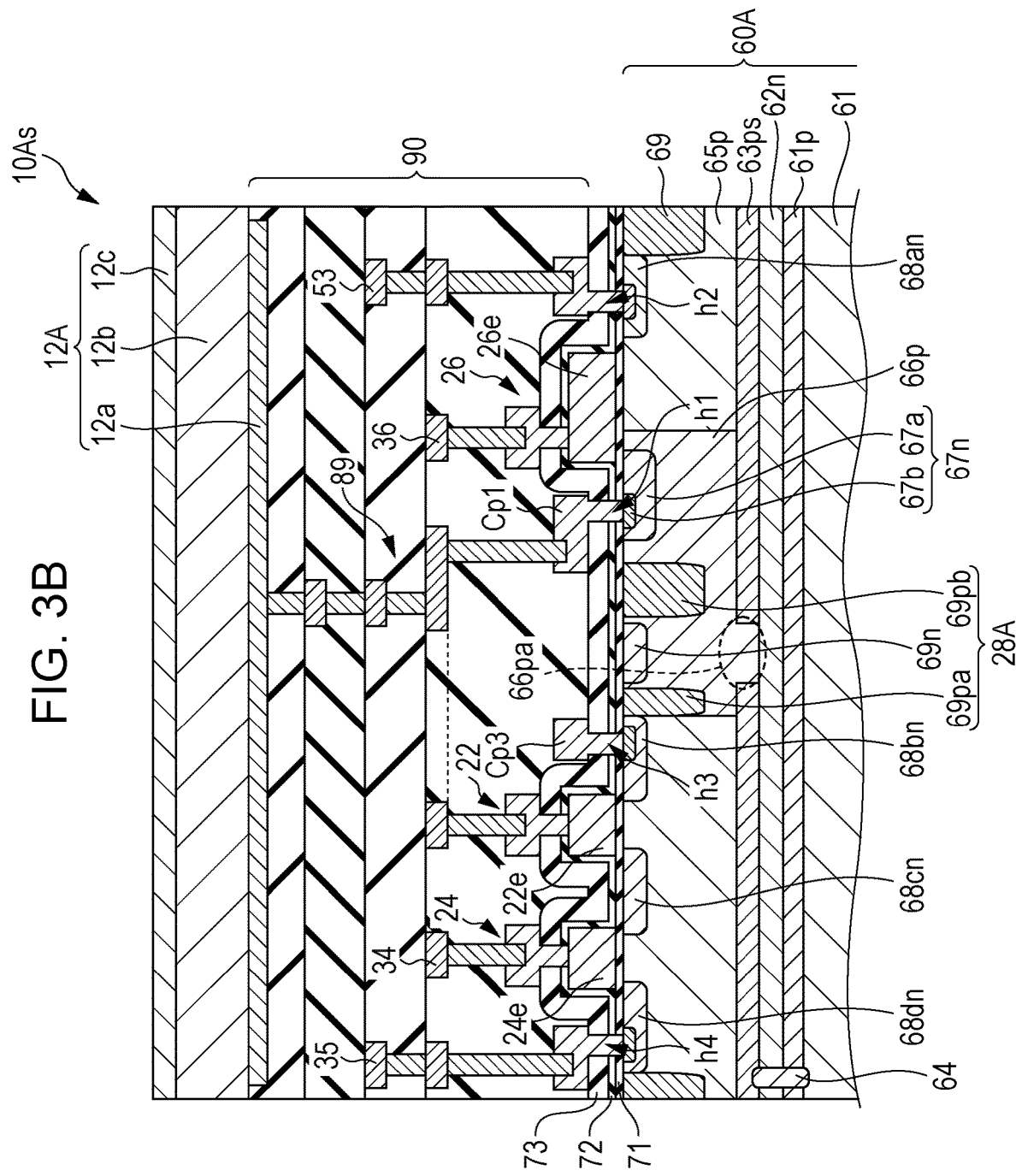
FIG. 3B is a cross-sectional diagram schematically illustrating a device structure of an imaging device according to a first modification of the first embodiment.

FIG. 3B schematically illustrates an exemplary configuration of the imaging device according to a first modification of the first embodiment. The primary difference between the pixel As illustrated in FIG. 3B and the pixel 10A described with reference to FIG. 3A is that in the pixel As, a p-type semiconductor layer 63ps is provided in the semiconductor substrate 60A instead of the p-type semiconductor layer 63p.

The p-type semiconductor layer 63ps is formed in a region other than directly below the impurity region 69n on the n-type semiconductor layer 62n, as schematically illustrated in FIG. 3B. In other words, the p-type semiconductor layer 63ps has an opening at the portion directly below the impurity region 69n. The impurity region 69pa that is part of the p-type impurity region 66p is located inside this opening, as illustrated in FIG. 3B.

As described above, the concentration of impurity of the p-type impurity region 66p is lower in comparison with the p-type semiconductor layer 65p. Accordingly, the p-type impurity region 69pa has a lower concentration of impurity than the p-type semiconductor layer 63p. The concentration of impurity in the p-type impurity region 69pa may be around $10^{16}$ cm$^{-3}$ for example. Providing a region with relatively low concentration of impurity to part of the p-type semiconductor layer 63p, and particularly at the position directly below the impurity region 69n, can cause the n-type semiconductor layer 62n to absorb unwanted minority carriers moving toward the n-type impurity region 67n, which will be described later by way of examples. As a result, the inflow of unwanted current to the n-type impurity region 67n serving as a charge accumulation region is suppressed even further, and effects of suppressed leak current can be anticipated.

Second Modification

Figure 4:
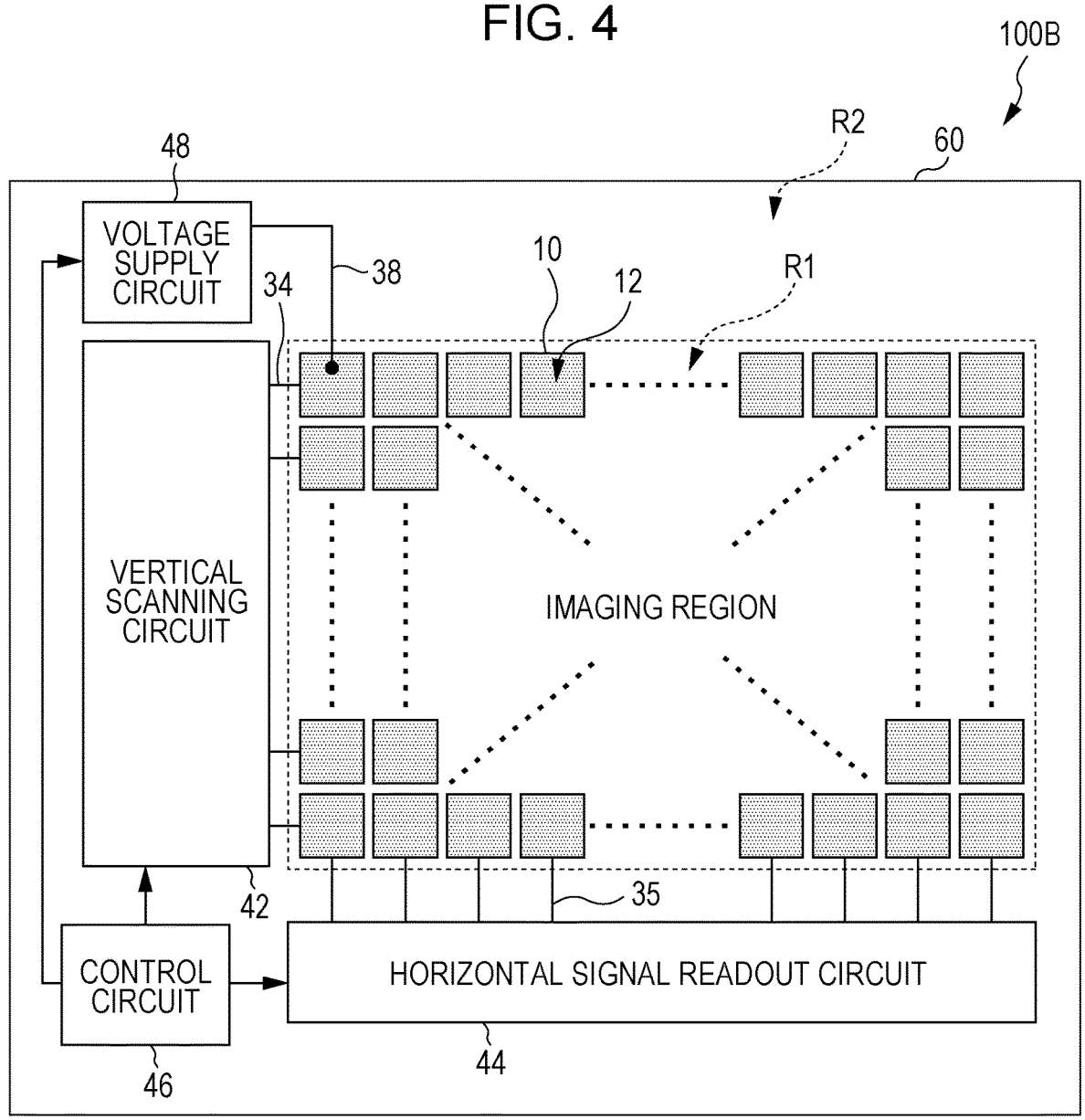
FIG. 4 is a diagram illustrating an exemplary configuration of an imaging device according to a second modification of the first embodiment.

FIG. 4 schematically illustrates an exemplary configuration of the imaging device according to the second modification of the first embodiment. The imaging device 100B illustrated in FIG. 4 further has a voltage supply circuit 48 disposed in the peripheral region R2 as compared with the imaging device 100A illustrated in FIG. 1.

The voltage supply circuit 48 supplies a predetermined voltage to the pixels 10 via a voltage line 38, based on drive signals from the control circuit 46, as schematically illustrated in FIG. 4. The voltage supply circuit 48 is not restricted to a particular power source circuit, and may be a circuit that converts voltage supplied from a power source such as a battery to a predetermined voltage, or may be a circuit that generates a predetermined voltage. The voltage supply circuit 48 may be part of the above-described vertical scanning circuit 42.

FIG. 5 schematically illustrates the device structure of a pixel that the imaging device 100b illustrated in FIG. 4 has. The gate electrode 22e is electrically connected to the conductive structure 89 at the layer where the address signal line 34, reset signal line 36, and so forth are located in the pixel 10B illustrated in FIG. 5 in the same way as the examples illustrated in FIGS. 3A and 3B.

The pixel 10B illustrated in FIG. 5 has a blocking structure 28B instead of the blocking structure 28A, in comparison with the pixel As described with reference to FIG. 3B. The blocking structure 28B further includes a contact plug Cp8, in addition to the impurity regions 69pa and 69pb and the impurity region 69n. The contact plug Cp8 is in contact with the impurity region 69n via a contact hole h8 provided to the first insulating layer 71, the second insulating layer 72, and the third insulating layer 73. The contact plug Cp8 electrically connects the impurity region 69n and the voltage line 38 to each other, as schematically illustrated in FIG. 5. Although the voltage line 38 is illustrated as being in the same layer as the address signal line 34 and reset signal line 36 in FIG. 5, the voltage line 38 has no electrical connection with any of the address signal line 34, reset signal line 36, and conductive structure 89.

The voltage line 38 has connection with the voltage supply circuit 48, as described with reference to FIG. 4. That is to say, the blocking structure 28B is configured to be capable of applying voltage to the impurity region 69n via the voltage line 38 in this example. When operating, the voltage supply circuit 48 supplies voltage to the impurity region 69n of the blocking structure 28 that is inverse bias as to the p-type semiconductor layer 65p, for example. That is to say, the voltage supply circuit 48 supplies voltage that is higher than that of the p-type semiconductor layer 65p to the impurity region 69n of the blocking structure 28B. Alternatively, the voltage supply circuit 48 may apply voltage to the impurity region 69n via the voltage line 38 so that the impurity region 69n and p-type semiconductor layer 65p are equipotential when operating. An example of a voltage where the impurity region 69n and p-type semiconductor layer 65p are equipotential may be voltage of 0 V.

Application of voltage by the voltage supply circuit 48 does not have to be perpetually executed when the imaging device 100B is operating, and it is sufficient to be executed in at least exposure periods, i.e., in charge accumulation periods where charge generated by the photoelectric conversion structure 12A is being accumulated in the n-type impurity region 67n. Applying voltage to the impurity region 69n can enable excess charges moving toward the n-type impurity region 67n serving as the charge accumulation region to be recovered by the impurity region 69n more efficiently. The voltage applied to the blocking structure 28B may be supplied from the vertical scanning circuit 42 instead.

As described above, the potential of the supporting substrate 61 and the p-type semiconductor layer 63p is controlled via substrate contacts. That is to say, controlling voltage applied to substrate contacts can control the potential of the p-type semiconductor layer 65p disposed on the p-type semiconductor layer 63p, and further control the potential of the impurity regions 69pa and 69pb disposed in the p-type semiconductor layer 65p. In other words, different voltages from each other can be individually applied to the impurity region 69n in the blocking structure 28B, and the impurity regions 69pa and 69pb in the blocking structure 28B.

Figure 6A:
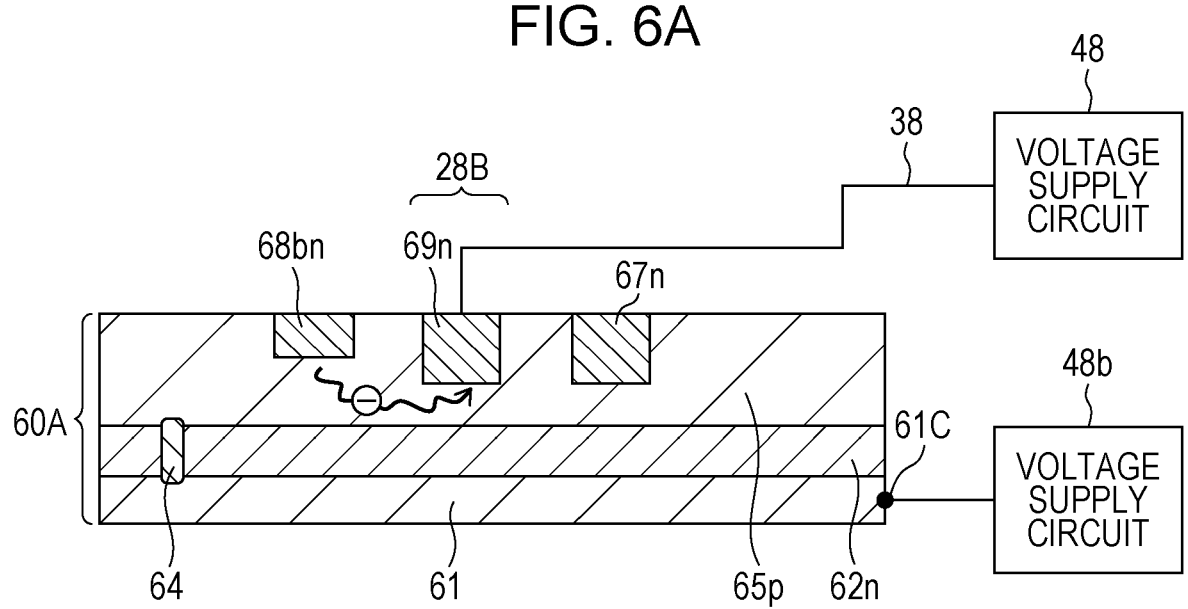
FIG. 6A is a diagram schematically illustrating an example of electrical connection between a second pixel and a voltage supply circuit.

FIG. 6A schematically illustrates an example of electrical connection between the pixel 10B and voltage supply circuit 48. In the configuration exemplified in FIG. 6A, a second voltage supply circuit 48b is connected to a substrate contact 61C. The voltage supply circuit 48b can control the potential of the impurity regions 69pa and 69pb in the blocking structure 28B via the supporting substrate 61, p-type region 64, p-type semiconductor layer 63p, and p-type semiconductor layer 65p, by supplying voltage to the substrate contact 61C. Voltage that is applied to the impurity regions 69pa and 69pb via the substrate contact 61C is lower than voltage applied to the impurity region 69n via the voltage line 38, for example. Alternatively, the same voltage, e.g., voltage of 0 V may be applied to the impurity regions 69pa and 69pb via the substrate contact 61C so that the impurity regions 69pa and 69pb, the p-type semiconductor layer 65p, and the impurity region 69n are equipotential. It is sufficient for application of voltage from outside of the impurity regions 69pa and 69pb to be performed selectively at least in charge accumulation periods, in the same way as voltage application of the blocking structure 28B to the impurity region 69n. An arrangement may be made where two individual voltage supply circuits are not provided, and voltage is independently supplied to the impurity region 69n and the substrate contact 61C by a single voltage supply circuit.

Figure 6B:
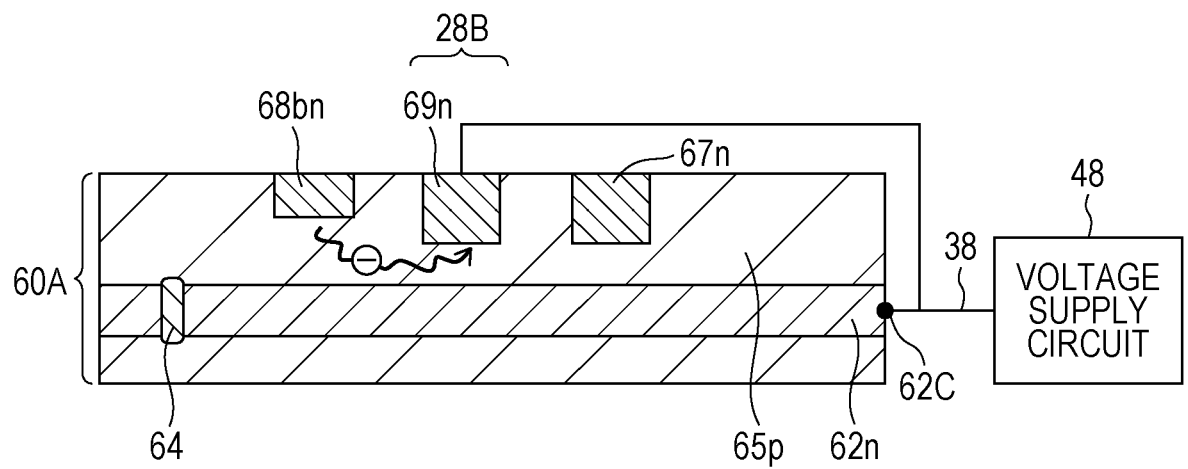
FIG. 6B is a diagram schematically illustrating another example of electrical connection between the second pixel and the voltage supply circuit.

FIG. 6B schematically illustrates another example of electrical connection between the pixel 10B and the voltage supply circuit 48. In the example illustrated in FIG. 6A, the voltage line 38 is connected not only to the impurity region 69n, but also to the n-type semiconductor layer 62n, by being connected to a well contact 62C. That is to say, in the configuration exemplified in FIG. 6B, the voltage supply circuit 48 can apply common voltage to both the impurity region 69n and n-type semiconductor layer 62n, in charge accumulation periods for example. The voltage applied to the n-type semiconductor layer 62n via the well contact 62C may be a voltage where the impurity region 69n has reverse bias as to the p-type semiconductor layer 65p. That is to say, the voltage applied to the n-type semiconductor layer 62n via the well contact 62C may be a higher voltage than that of the p-type semiconductor layer 65p. Alternatively, this may be a voltage where the impurity region 69n and p-type semiconductor layer 65p become equipotential, such as voltage of 0 V, for example. Of course, the potential of the impurity regions 69pa and 69pb in the blocking structure 28B may be further controlled via the substrate contact 61C, as in the example described with reference to FIG. 6A.

For example, voltage may be applied to the n-type semiconductor layer 62n and impurity region 69n that is reverse bias as to the p-type semiconductor layer 65p. That is to say, voltage that is higher than that of the p-type semiconductor layer 65p may be applied to the n-type semiconductor layer 62n and impurity region 69n. This sort of voltage application enables minority carriers that cause leak current to be absorbed by the blocking structure 28B even more efficiently. That is to say, applying voltage to both the impurity region 69n and n-type semiconductor layer 62n enables excess changes moving toward the n-type impurity region 67n serving as the charge accumulation region to be recovered by the impurity region 69n or n-type semiconductor layer 62n even more efficiently.

Figure 7:
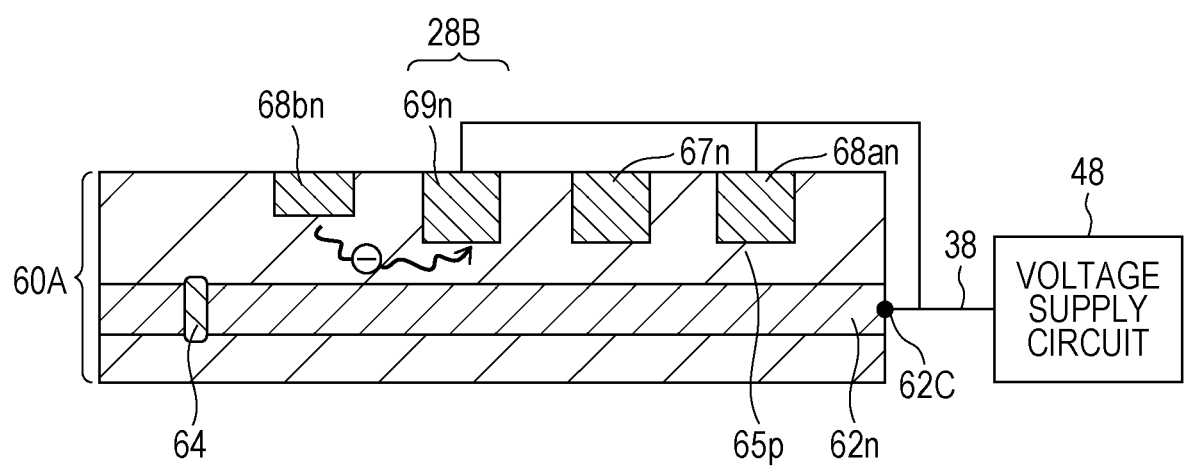
FIG. 7 is a diagram schematically illustrating yet another example of electrical connection as to a shielding structure.

FIG. 7 schematically illustrates yet another example of electrical connection to the blocking structure 28B. The voltage line 38 may be connected to the n-type impurity region 68an of the reset transistor 26 instead of the feedback line 53, as illustrated in FIG. 7. That is to say, the voltage supply circuit 48 also functions as a reset voltage source to supply reset voltage to the pixels in this example. Supplying a common voltage to the reset transistor 26 and the impurity region 69n of the blocking structure 28B does away with the need to provide a separate reset voltage source, which is advantageous with regard to reduction in size of the imaging device.

Third Modification

Figure 8:
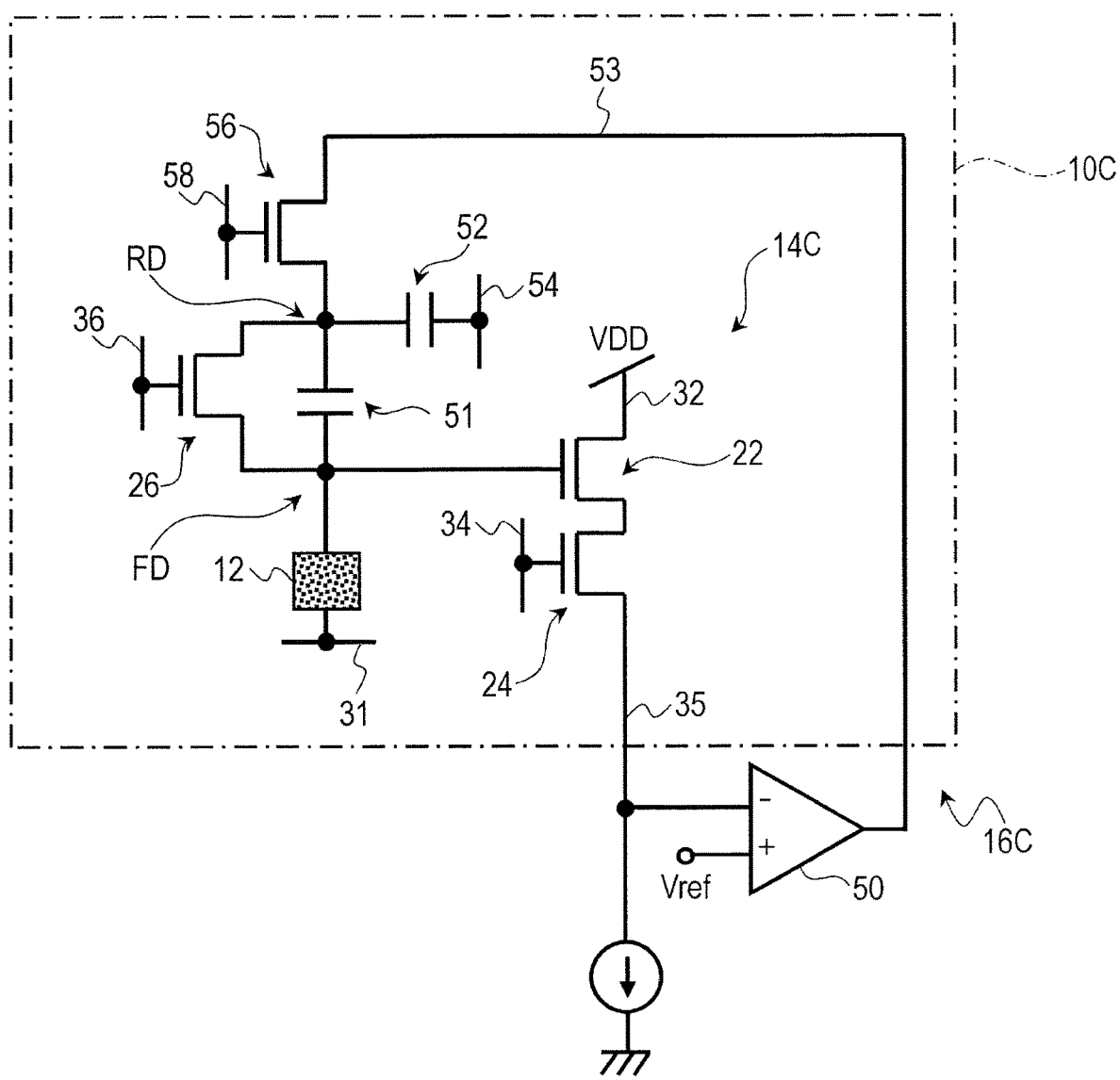
FIG. 8 is a schematic diagram illustrating the circuit configuration of a third modification of the imaging device according to the first embodiment.

FIG. 8 illustrates a third modification of the imaging device according to the first embodiment. FIG. 8 illustrates an exemplary circuit configuration of a pixel 10C that has been representatively selected from pixels 10C according to the third modification of the imaging device. A signal detection circuit 14C of the pixel 10C illustrated in FIG. 8 further includes, in addition to the signal detecting transistor 22, address transistor 24, and reset transistor 26, a bandwidth control transistor 56, a first capacitive element 51, and a second capacitive element 52, in comparison with the signal detection circuit 14A illustrated in FIG. 2.

The bandwidth control transistor 56 is connected between the reset transistor 26 and feedback line 53, and the gate thereof is connected to a feedback control line 58. The feedback control line 58 is connected to the vertical scanning circuit 42, for example, with the gate voltage of the bandwidth control transistor 56 being controlled by the vertical scanning circuit 42 when the imaging device is operating.

The first capacitive element 51 has a relatively small capacitance value, and is connected to the reset transistor 26 in parallel. The second capacitive element 52 has a larger capacitance value than the first capacitive element 51, with one electrode being connected to a node RD between he reset transistor 26 and bandwidth control transistor 56, and the other electrode of the second capacitive element 52 being connected to a sensitivity adjustment line 54. The sensitivity adjustment line 54 is connected to the vertical scanning circuit 42, for example, and the potential thereof is set to 0 V, for example, when the imaging device 100 is operating.

A feedback path that includes the signal detecting transistor 22 and the bandwidth control transistor 56 in the path can be formed by turning the bandwidth control transistor 56 on. That is to say, the feedback path formed by the feedback circuit 16C illustrated in FIG. 8 includes the bandwidth control transistor 56 in addition to the inverting amplifier 50. The second capacitive element 52 and bandwidth control transistor 56 may function as a resistor-capacitor (RC) filter circuit.

Formation of the feedback loop where part or all of the output signals of the signal detecting transistor 22 are fed back electrically enables the effects of kTC noise that occurs when the reset transistor 26 and bandwidth control transistor 56 go off to be reduced. Details of such noise cancellation using feedback are described in Japanese Unexamined Patent Application Publication No. 2017-046333. The reset transistor 26 can also be made to function as a gain switching transistor in the circuit configuration exemplified in FIG. 8. Details of such mode switching are also described in Japanese Unexamined Patent Application Publication No. 2017-046333. Japanese Unexamined Patent Application Publication No. 2017-046333 is incorporated herein by reference in its entirely, for reference.

The circuit configuration such as illustrated in FIG. 8, where the bandwidth control transistor 56 is connected between the reset transistor 26 and the feedback line 53, is advantageous from the perspective of noise reduction, since contamination by excess charges at the node RD from the drain region of the signal detecting transistor 22, for example, can be suppressed, and leak current at the node RD can be suppressed. Applying a connection structure the same as that of the charge accumulation node FD to the node RD enables leak current to be suppressed at the node RD, which will be described below.

Device Configuration of Pixel 10C

Figure 9:
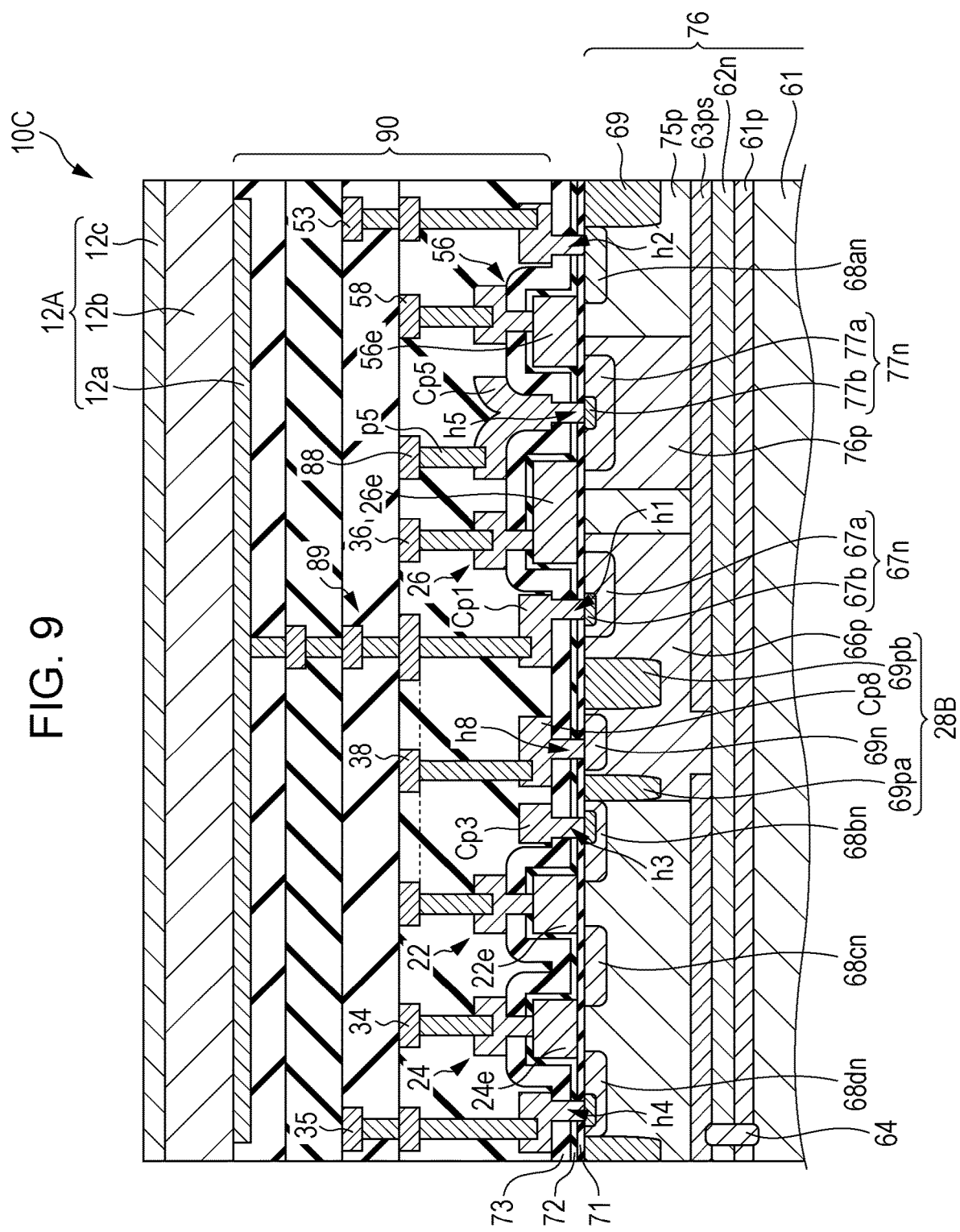
FIG. 9 is a cross-sectional diagram schematically illustrating an example of the device structure of a third pixel illustrated in FIG. 8.

FIG. 9 schematically illustrates an example of the device structure of the pixel 10C illustrated in FIG. 8. In the configuration exemplified in FIG. 9, the pixel 10C includes a semiconductor substrate 76 that supports the photoelectric conversion structure 12A. The semiconductor substrate 76 has the supporting substrate 61, and multiple semiconductor layers including the p-type semiconductor layer 63ps on the supporting substrate 61, in the same way as the semiconductor substrate 60A illustrated in FIGS. 3B and 5. The semiconductor substrate 76 has a p-type semiconductor layer 75p formed on the p-type semiconductor layer 63ps. The concentration of impurity of the p-type semiconductor layer 75p may be around the same as that of the above-described p-type semiconductor layer 65p. The p-type semiconductor layer 75p has the p-type impurity region 66p and a p-type impurity region 76p. The concentration of impurity of the p-type impurity region 76p may be around the same as that of the above-described p-type impurity region 66p. An n-type impurity region 77n is formed on the p-type impurity region 76p. The n-type impurity region 77n functions as one of the drain region and source region of the reset transistor 26.

The n-type impurity region 77n includes a first region 77a, and a second region 77b located within the first region 77a, in the same way as the n-type impurity region 67n. The first region 77a has a concentration of impurity that is around the same, for example, as the first region 67a of the n-type impurity region 67n. Alternatively, the concentration of impurity of the first region 77a is higher than that of the first region 67a of the n-type impurity region 67n. This is because the tolerance value of leak current can be set higher for the node RD as compared to the charge accumulation node FD. Parasitic resistance at the source side of the reset transistor 26, for example, can be reduced by making the concentration of impurity of the first region 77a to be higher than the concentration of impurity of the first region 67a, and the current driving performance of the reset transistor 26 can be improved.

In the example exemplified in FIG. 9, the layered structure of the first insulating layer 71, second insulating layer 72, and third insulating layer 73 has a contact hole h5 provided in a region on the n-type impurity region 77n. A contact plug Cp5 is connected to the n-type impurity region 77n via this contact hole h5. The contact plug Cp5 is connected to the second region 77b of the n-type impurity region 77n in this example. Now, the second region 77b has a higher concentration of impurity than the first region 77a. Although formation of the second region 77b having a high concentration of impurity within the n-type impurity region 77n is not indispensable, forming the second region 77b within the n-type impurity region 77n yields the effects of reduced contact resistance.

The contact plug Cp5 is on the same layer as other contact plugs such as the contact plug Cp1, and typically is formed by patterning of a polysilicon film. The contact plug Cp5 is connected to wiring 88 via a metal plug p5 disposed within the insulating layer 90 and so forth. The wiring 88 is wiring connected to, out of the electrodes that the second capacitive element 52 has, the electrode at the side not connected to the sensitivity adjustment line 54. In this example as well, the voltage line 38 is located in the same layer as the address signal line 34 and reset signal line 36, in the same way as the example described with reference to FIG. 5. However, the voltage line 38 is not electrically connected to any of the address signal line 34, reset signal line 36, and conductive structure 89. The first capacitive element 51 and second capacitive element 52 omitted from illustration in FIG. 9 may be formed in the pixel 10C in the form of a metal-insulator-semiconductor (MIS) structure, or may be formed in the form of a metal-insulator-meta (MIM) structure. Using the MIM structure enables a larger capacitance value to be obtained.

The upper face of the contact plug Cp5 does not have a metal silicide layer. Accordingly, the metal plug p5 is directly connected to the upper face of the contact plug Cp5 in this example. Directly connecting the metal plug p5 to the contact plug Cp5 without going through a metal silicide layer enables dispersion of metal into the n-type impurity region 77n via the contact plug Cp5, particularly dispersion of nickel, to be prevented. In other words, contamination of the node RD by excess changes can be suppressed, and noise at the pixel 10C can be further suppressed.

In the example exemplified in FIG. 9, the bandwidth control transistor 56 shares the n-type impurity region 77n with the reset transistor 26. That is to say, in the configuration exemplified in FIG. 9, the n-type impurity region 77n also functions as one of the source region and drain region of the bandwidth control transistor 56. The n-type impurity region 68an is formed in the p-type semiconductor layer 75p in the same way as the n-type impurity regions 68bn through 68dn, and functions as the other of the source region and drain region of the bandwidth control transistor 56.

The bandwidth control transistor 56 further has a gate electrode 56e located on the first insulating layer 71. The gate electrode 56e typically is a polysilicon electrode, and is located in the same layer as the gate electrode 22e of the signal detecting transistor 22, the gate electrode 24e of the address transistor 24, and the gate electrode 26e of the reset transistor 26. The gate electrode of these transistors typically is a polysilicon electrode that has been imparted conductivity by doping with an n-type impurity.

The pixel 10C also has the blocking structure 28B including the impurity region 69n interposed between the n-type impurity region 68bn and n-type impurity region 67n, in the same way as the example illustrated in FIG. 5. The blocking structure 28B further includes the contact plug Cp8 connected to the impurity region 69n, in comparison with the above-described blocking structure 28A. The contact plug Cp8 is connected to the impurity region 69n via the contact hole h8 provided to the layered structure of the first insulating layer 71, second insulating layer 72, and third insulating layer 73, as schematically illustrated in FIG. 9. The contact plug Cp8 is also connected to the voltage line 38, and is configured so that a predetermined voltage can be applied from the voltage supply circuit 48.

Figure 10:
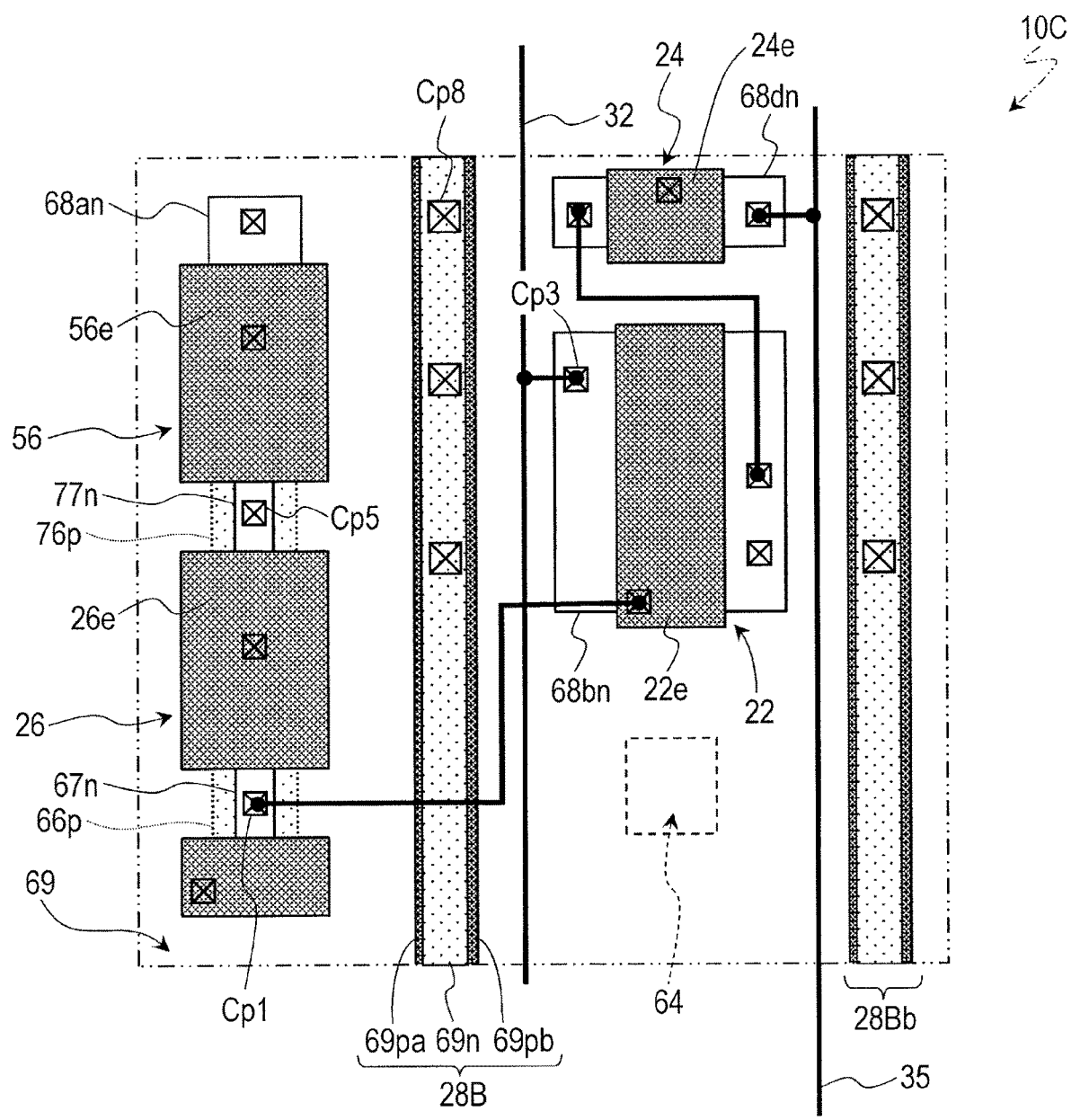
FIG. 10 is a schematic plan view illustrating an example of a layout of elements in the third pixel.

FIG. 10 illustrates an example of the layout of elements in the pixel 10C. Note that while the above-described FIG. 9 illustrates the signal detecting transistor 22, address transistor 24, reset transistor 26, and bandwidth control transistor 56 all in the same cross-section, this is only for the sake of convenience in describing. Accordingly, there may be portions where the cross-section obtained by cutting the element layout illustrated in FIG. 10 along a certain line, and the cross-section illustrated in FIG. 9 do not coincide with each other.

In the configuration exemplified in FIG. 10, the reset transistor 26 and bandwidth control transistor 56 are arrayed on a straight line in the vertical direction of the plane of the drawing. Accordingly, the second region 77b that is the connecting portion of the contact plug Cp5 and the semiconductor substrate 76 is located between the gate electrode 26e of the reset transistor 26 and the gate electrode 56e of the bandwidth control transistor 56. The signal detecting transistor 22 and address transistor 24 also are arrayed on a straight line in the vertical direction of the plane of the drawing. The vertical signal line 35 also extends in the vertical direction of the plane of the drawing as shown in FIG. 10, and accordingly, the vertical direction of the plane of the drawing here is parallel to the column direction of the multiple pixels 10C.

The pixel isolation region 69 including the impurity regions 69pa and 69pb in a part thereof is disposed at the periphery of regions where the set of reset transistor 26 and bandwidth control transistor 56, and the signal detecting transistor 22 and the address transistor 24, have been formed. Accordingly, these regions are electrically isolated from each other by the pixel isolation region 69. In this example, the blocking structure 28B is located between the n-type impurity region 68bn and the n-type impurity region 67n, and extends from one edge portion of the pixel 10C to the other edge portion along the vertical signal line 35 in plan view. The impurity region 69n and the impurity regions 69pa and 69pb making up the blocking structure 28B also extends from one edge portion of the pixel 10C to the other edge portion.

By positioning the blocking structure 28B between the n-type impurity region 68bn serving as the drain region of the signal detecting transistor 22 and the n-type impurity region 67n serving as the charge accumulation region, minority carriers generated at the n-type impurity region 68bn and moving toward the n-type impurity region 67n can be blocked by the blocking structure 28B. Also, at least part of the blocking structure 28B is also located between the n-type impurity region 68bn and the n-type impurity region 77n in this example, so minority carriers generated at the n-type impurity region 68bn and moving toward the n-type impurity region 77n can be blocked by the blocking structure 28B. That is to say, occurrence of leak current at the node RD can be suppressed as well. Particularly in this example, the impurity regions 69pa and 69pb in the blocking structure 28B have a layout that sandwiches the impurity region 69n, and the blocking structure 28B extends from one edge portion of the pixel 10C to the other edge portion in plan view. Accordingly, effects of suppressing occurrence of leak current due to movement of minority carriers from not only the n-type impurity region 68bn but also from the n-type impurity regions 68cn and 68dn toward the n-type impurity regions 67n and 77n can be anticipated.

Further, a blocking structure 28Bb that extends over a region other than the region between the n-type impurity region 68bn and the n-type impurity region 67n or 77n may be disposed in the pixel, as exemplified in FIG. 10. In the example exemplified in FIG. 10, the blocking structure 28Bb is disposed at the right side of the signal detecting transistor 22 and address transistor 24 in the plane of the drawing, extending form one edge portion of the pixel 10C to the other edge portion along the vertical signal line 35. The blocking structure 28Bb may have the same structure as the above-described blocking structure 28B.

Figure 11:
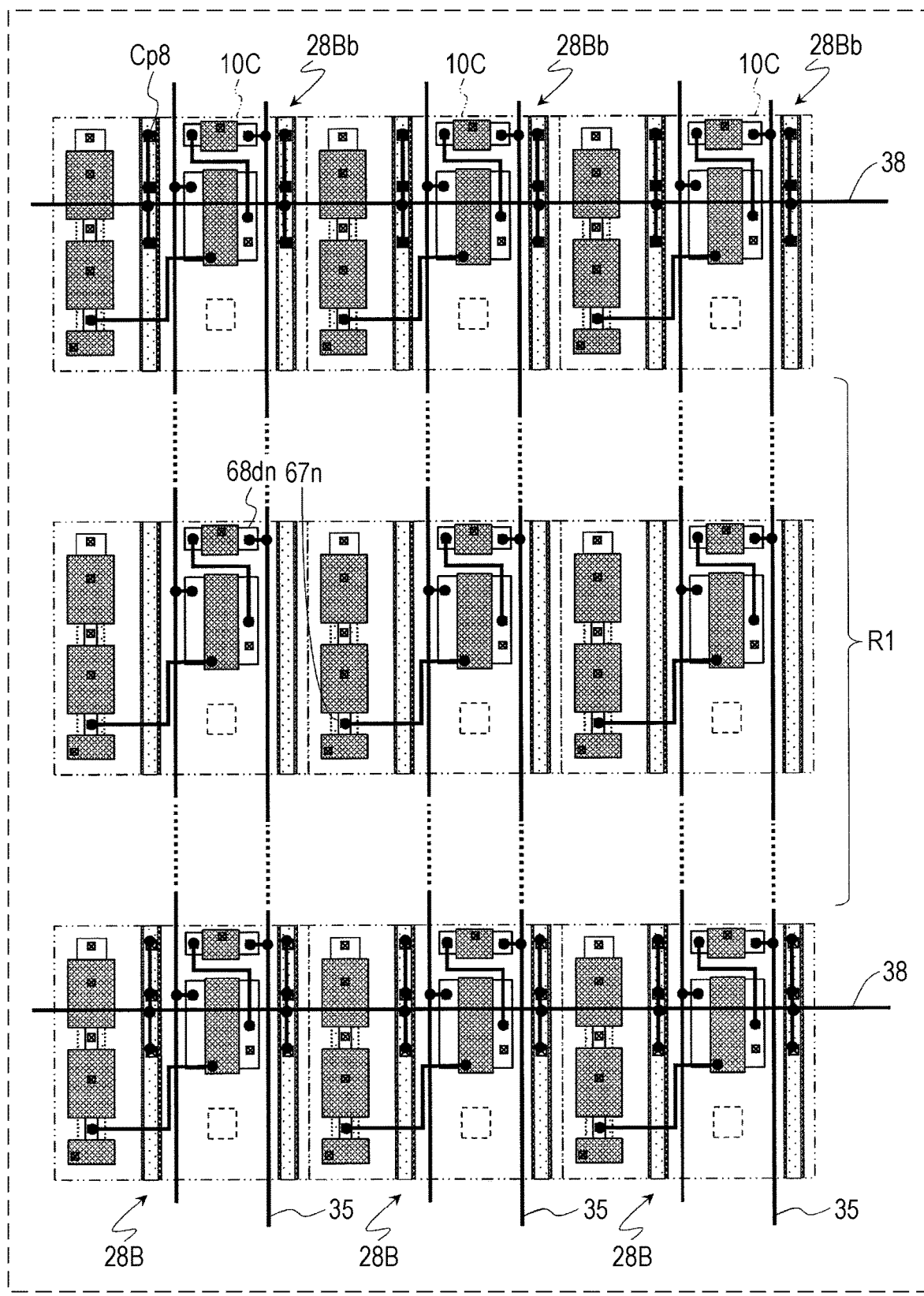
FIG. 11 is a schematic plan view illustrating an example of a two-dimensional array of the third pixels illustrated in FIG. 10.

FIG. 11 illustrates an example of a two-dimensional array of the pixels 10C illustrated in FIG. 10. The pixels 10C can be arrayed two-dimensionally on the semiconductor substrate 60A, for example, as described earlier with reference to FIG. 1. It can be seen from FIG. 11 that when the pixels 10C illustrated in FIG. 10 are two-dimensionally laid out, the blocking structure 28Bb is located between, for example, the n-type impurity region 68bn of the pixel 10C to which that blocking structure 28Bb is provided, and the n-type impurity regions 67n and 77n of the adjacent pixel 10C. That is to say, a blocking structure 28Bb always is interposed between the n-type impurity region 68dn and the n-type impurity region 67n that is closest to that n-type impurity region 68dn, in the row direction. Accordingly, inflow of excess minority carriers from the n-type impurity region 68dn or the like of a certain pixel 10C to the n-type impurity region 67n of a pixel 10C adjacent in the row direction to that pixel 10C can be effectively suppressed.

Note that in the example illustrated in FIG. 11, the blocking structures 28B and 28Bb continuously extend over multiple pixels 10C arrayed in the column direction. However, the contact plug Cp8 is selectively provided to pixels 10C located at both ends, out of the multiple pixels 10C arrayed in the column direction. Thus, in a case where the blocking structures 28B and 28Bb continuously extend over multiple pixels 10C, contact plugs Cp8 may be provided to pixels 10C located at both ends out of the multiple pixels 10C arrayed in the column direction, and contact plugs Cp8 be omitted from the remaining pixels 10C.

Pixels where the contact plugs Cp8 have been placed may be dummy pixels placed outside of the imaging region R1. Providing dummy pixels that are not intended to acquire image signals, and selectively disposing the contact plugs Cp8 in the dummy pixels enables dispersion of impurities from the contact plugs Cp8 to the semiconductor substrate 76 due to connection of the contact plugs Cp8 to the semiconductor substrate 76 to be avoided at the other pixels. Accordingly, occurrence of unwanted carriers around the contact can be suppressed in pixels where the contact plug Cp8 has been omitted. As a result, leak current is suppressed at the n-type impurity region 67n.

One or both of the above-described well contact 62C and substrate contact 61C may be formed in the region where dummy pixels are disposed. By forming the impurity region 69pa and impurity region 69pb continuously over multiple pixels as exemplified in FIG. 11, common voltage can be applied in a batch to the impurity region 69pa and impurity region 69pb in multiple pixels belonging to the same column by applying voltage to the substrate contact 61C disposed in a dummy pixel.

Figure 12:
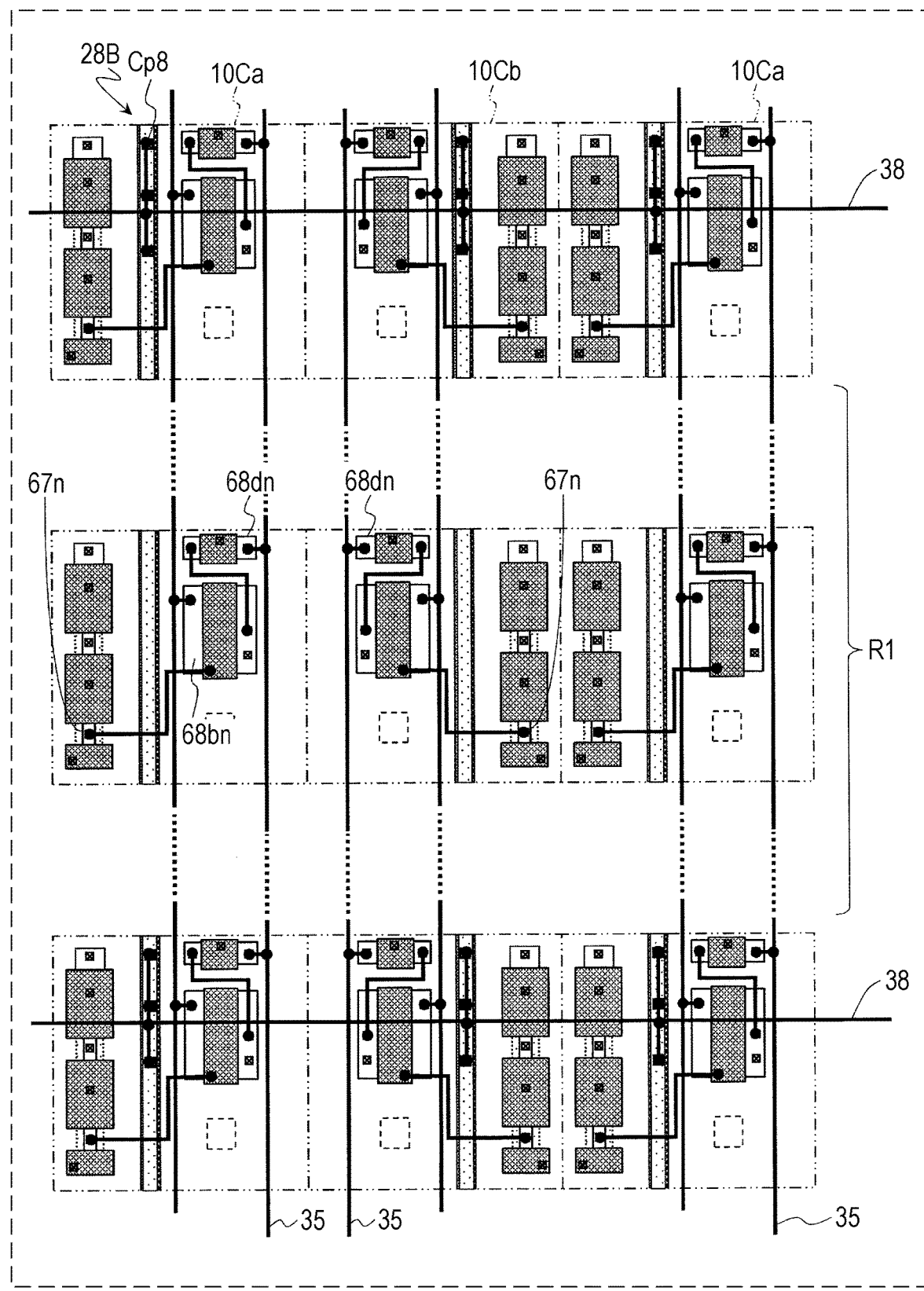
FIG. 12 is a schematic plan view illustrating another example of a two-dimensional array of the third pixels.

FIG. 12 illustrates another example of the two-dimensional array of the pixels 10C. In this example, pixels 10Ca that have the same element layout as the example illustrated in FIG. 10, and pixels 10Cb that have a structure of a mirror image of the pixels 10Ca on a virtual axis passing through the center of the pixels 10Ca and extending parallel to the column direction of the multiple pixels, are alternately arrayed in the row direction of the multiple pixels. That is to say, in the column direction of the multiple pixels, i.e., in the vertical direction of the plane of the drawing, pixels 10Ca are adjacent to pixels 10Ca, and pixels 10Cb are adjacent to pixels 10Cb.

Looking at the n-type impurity region 68bn for example, a blocking structure 28B is always interposed between the n-type impurity region 68bn and the n-type impurity region 67n closest to that n-type impurity region 68bn in the row direction, due to employing this array of pixels. In other words, a situation can be avoided where an n-type impurity region 68bn and n-type impurity region 67n are adjacent in the row direction without a blocking structure 28B interposed therebetween, among mutually adjacent pixels 10Ca and pixels 10Cb. Accordingly, the blocking structures 28Bb can be omitted. An array may be employed where pixels 10Ca and pixels 10Cb are disposed alternately repeating in the column direction instead of in the row direction, or in addition to in the row direction.

Fourth Modification

Figure 13:
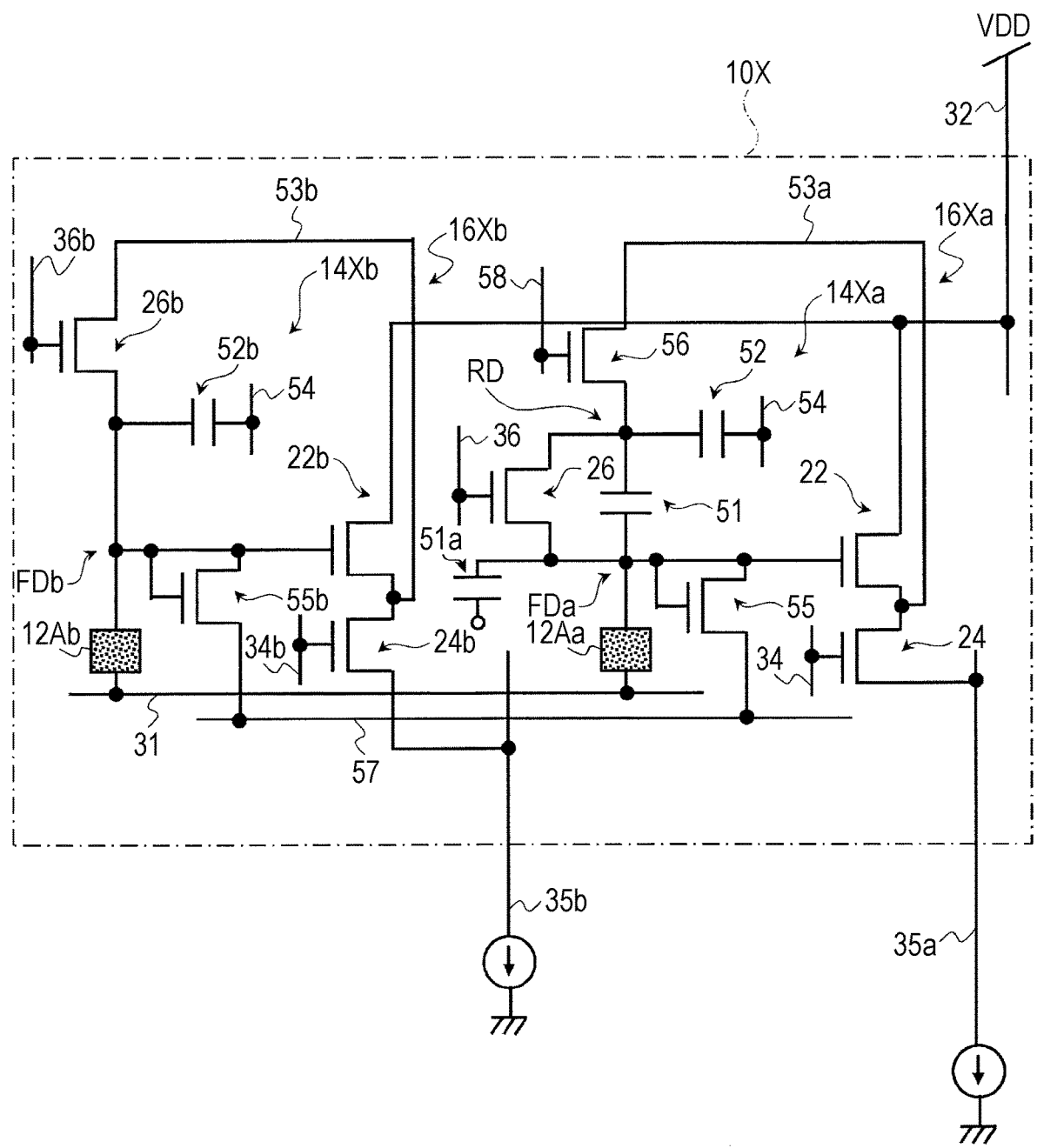
FIG. 13 is a schematic diagram illustrating the circuit configuration of a fourth modification of the imaging device according to the first embodiment of the present disclosure.

FIG. 13 illustrates a fourth modification of the imaging device according to the first embodiment of the present disclosure. A pixel 10X illustrated in FIG. 13 has a photoelectric conversion structure 12Aa and a photoelectric conversion structure 12Ab.

As illustrated in FIG. 13, a signal detection circuit 14Xa is connected to the photoelectric conversion structure 12Aa, and a signal detection circuit 14Xb is connected to the photoelectric conversion structure 12Ab. For example, the photoelectric conversion structure 12Aa and photoelectric conversion structure 12Ab have the opposing electrode and photoelectric conversion layer 12b in common, but on the other hand, have pixel electrodes that are electrically independent from each other. The pixel electrode of the photoelectric conversion structure 12Aa is electrically connected to a charge accumulation node FDa, and the signal detection circuit 14Xa reads out to a vertical signal line 35a signals corresponding to signal charges generated by the photoelectric conversion structure 12Aa and stored in the charge accumulation node FDa. On the other hand, the pixel electrode of the photoelectric conversion structure 12Ab is electrically connected to a charge accumulation node FDb, and the signal detection circuit 14Xb reads out to a vertical signal line 35b signals corresponding to signal charges generated by the photoelectric conversion structure 12Ab and stored in the charge accumulation node FDb. That is to say, the pixel 10X is configured to be capable of independently reading out two types of signals, in accordance with which of the signal detection circuit 14Xa and signal detection circuit 14Xb is used to execute readout of signals.

In the example illustrated in FIG. 13, the signal detection circuit 14Xa has a circuit configuration similar to that of the signal detection circuit 14C of the pixel 10C illustrated in FIG. 8, and includes the signal detecting transistor 22, address transistor 24, reset transistor 26, bandwidth control transistor 56, first capacitive element 51, and second capacitive element 52. In this example, the signal detection circuit 14Xa further includes a third capacitive element 51a of which one electrode is connected to the charge accumulation node FDa. The third capacitive element 51a may have a capacitance value around the same as that of the first capacitive element 51.

The signal detection circuit 14Xa also has a feedback circuit 16Xa for feedback of part or all of the output signals of the signal detecting transistor 22. Note however, that a feedback line 53a connected to one of the source and drain of the bandwidth control transistor 56 is connected to the source of the signal detecting transistor 22. That is to say, in the feedback circuit 16Xa, the output of the signal detecting transistor 22 itself is used as the reference voltage for resetting.

This circuit configuration also enables a feedback loop to be formed where part or all of the output signals of the signal detecting transistor 22 are fed back electrically, and the effects of kTC noise that occurs when the reset transistor 26 and bandwidth control transistor 56 go off can be reduced. Moreover, the inverting amplifier 50 has been omitted in comparison with the example in FIG. 8, so noise cancellation using feedback can be implemented in increments of pixels 10X. Details of noise cancellation in increments of pixels using feedback is described in Japanese Unexamined Patent Application Publication No. 2016-127593, for example. Japanese Unexamined Patent Application Publication No. 2016-127593 is incorporated herein by reference in its entirely, for reference.

The signal detection circuit 14Xa further has a protection transistor 55 in this example. The drain or source of the protection transistor 55, and the gate, are connected to the charge accumulation node FDa between the gate of the signal detecting transistor 22 and the photoelectric conversion structure 12Aa. The one of the drain and source of the protection transistor 55 that is not connected to the photoelectric conversion structure 12Aa is connected to a power line 57 that receives supply of a predetermined power source when the imaging device 100A is operating, by being connected to a power source that is omitted from illustration.

On the other hand, looking at the signal detection circuit 14Xb having electrical connection with the photoelectric conversion structure 12Ab, the signal detection circuit 14Xb includes a second signal detecting transistor 22b having a gate connected to the photoelectric conversion structure 12Ab, an address transistor 24b connected between the signal detecting transistor 22b and the vertical signal line 35b, a reset transistor 26b connected between the photoelectric conversion structure 12Ab and a feedback line 53b, and a second protection transistor 55b. The gate of the reset transistor 26b is connected to the reset signal line 36b, and the vertical scanning circuit 42, for example, controls on and off of the reset transistor 26b by control of the potential at the reset signal line 36b. The drain or source of the protection transistor 55b and the gate thereof are connected to a charge accumulation node FDb between the gate of the signal detecting transistor 22b and photoelectric conversion structure 12Ab, and the one of the drain and source of the protection transistor 55b that is not connected to the photoelectric conversion structure 12Ab is connected to the power line 57, in the same way as the above-described protection transistor 55.

An address signal line 34b is connected to the gate of the address transistor 24b of the signal detection circuit 14Xb. The address signal line 34b is connected to the vertical scanning circuit 42 for example, and the vertical scanning circuit 42, controls on and off of the address transistor 24b by control of the potential at the address signal line 34b. That is to say, according to the circuit exemplified in FIG. 13, one of the signal detection circuits 14Xa and 14Xb can be selected and signals corresponding to the amount of charge accumulated in the charge accumulation node FDa or signals corresponding to the amount of charge accumulated in the charge accumulation node FDb can be selectively read out.

The signal detection circuit 14Xb includes a feedback circuit 16Xb. Accordingly, due to formation of a feedback loop where part or all of the output signals of the signal detecting transistor 22b are fed back electrically, the kTC noise that occurs when the reset transistor 26b go off can be reduced, in the same way as with the signal detection circuit 14Xa.

The signal detection circuit 14Xb has, as a part thereof, a capacitive element 52b having a relatively large capacitance value by being provided within the pixel 10X in a MIM structure, for example. As illustrated in FIG. 13, one electrode of the capacitive element 52b is connected to the charge accumulation node FDb, and the other electrode is connected to the sensitivity adjustment line 54. The capacitive element 52*b* connected to the charge accumulation node FDb has functions of increasing the capacitance value of the overall charge accumulation region that accumulates signal charges.

According to the circuit exemplified in FIG. 13, signals in accordance with the amount of charge accumulated in the charge accumulation node FDa and signals in accordance with the amount of charge accumulated in the charge accumulation node FDb can be selectively read out, as described above. The capacitive element 52*b* that has a relatively large capacitance value is connected to the charge accumulation node FDb in the signal detection circuit 14Xb, and accordingly, more signal charges can be stored, which is advantageous in shooting in a high-luminance environment, for example. On the other hand, the signal detection circuit 14Xa includes, as a part thereof, the first capacitive element 51 connected in parallel to the reset transistor 26, and can execute noise cancellation more effectively while suppressing increase in the capacitance value of the overall charge accumulation region. Accordingly, this is particularly advantageous in shooting with high sensitivity. Thus, an arrangement may be made where two signal detection circuits are provided within one pixel, and readout of signals is executed via the signal detection circuit of these that is more suitable for the shooting scene. The term "pixel" in the present specification indicates, for example, a unit configuring a repetitive structure in the imaging region R1, and is not restricted to a structure including a single signal detection circuit but rather may include two or more signal detection circuits.

Figure 14:
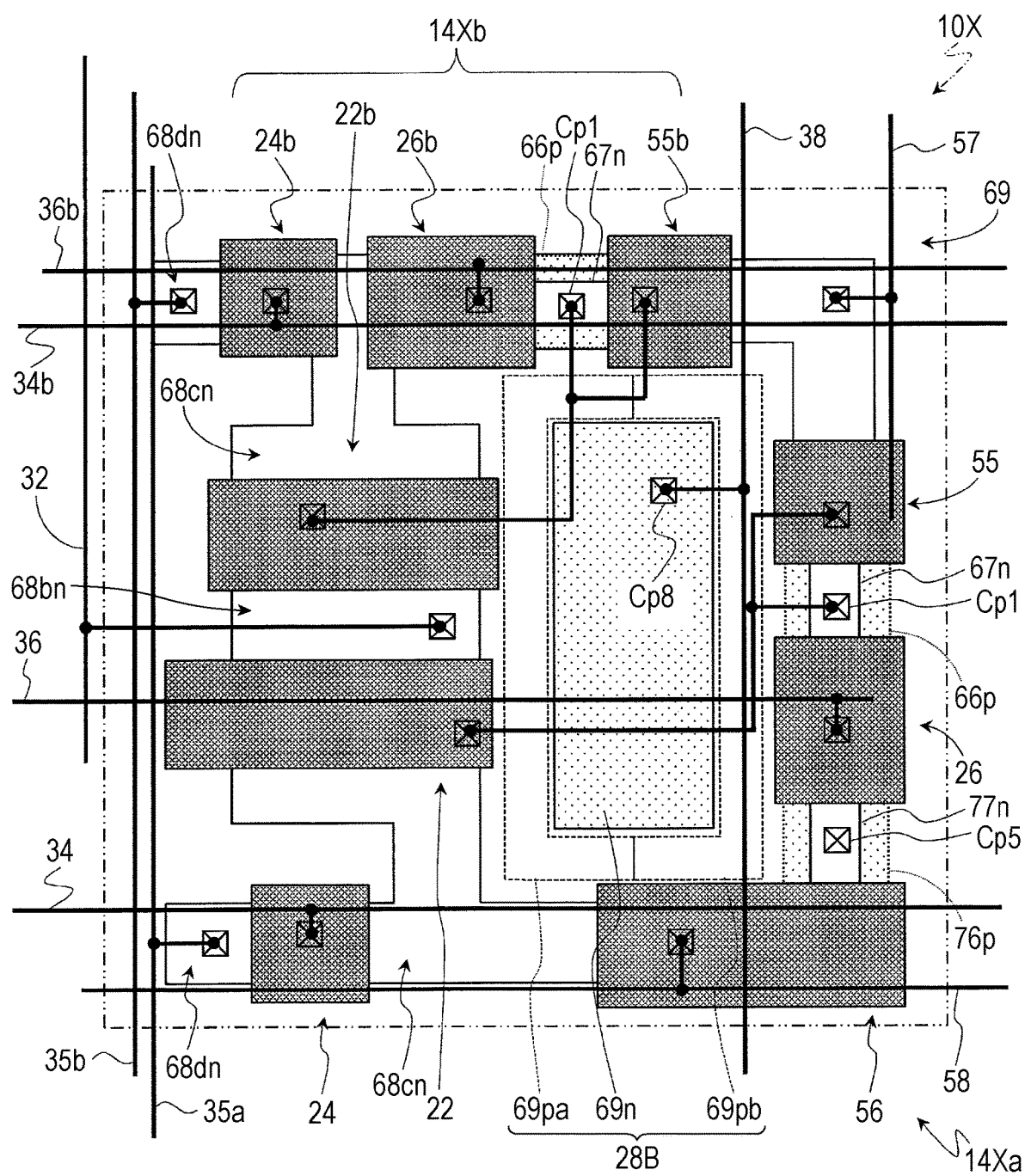
FIG. 14 is a schematic plan view illustrating an example of the layout of elements in the fourth pixel illustrated in FIG. 13.
Figure 15:
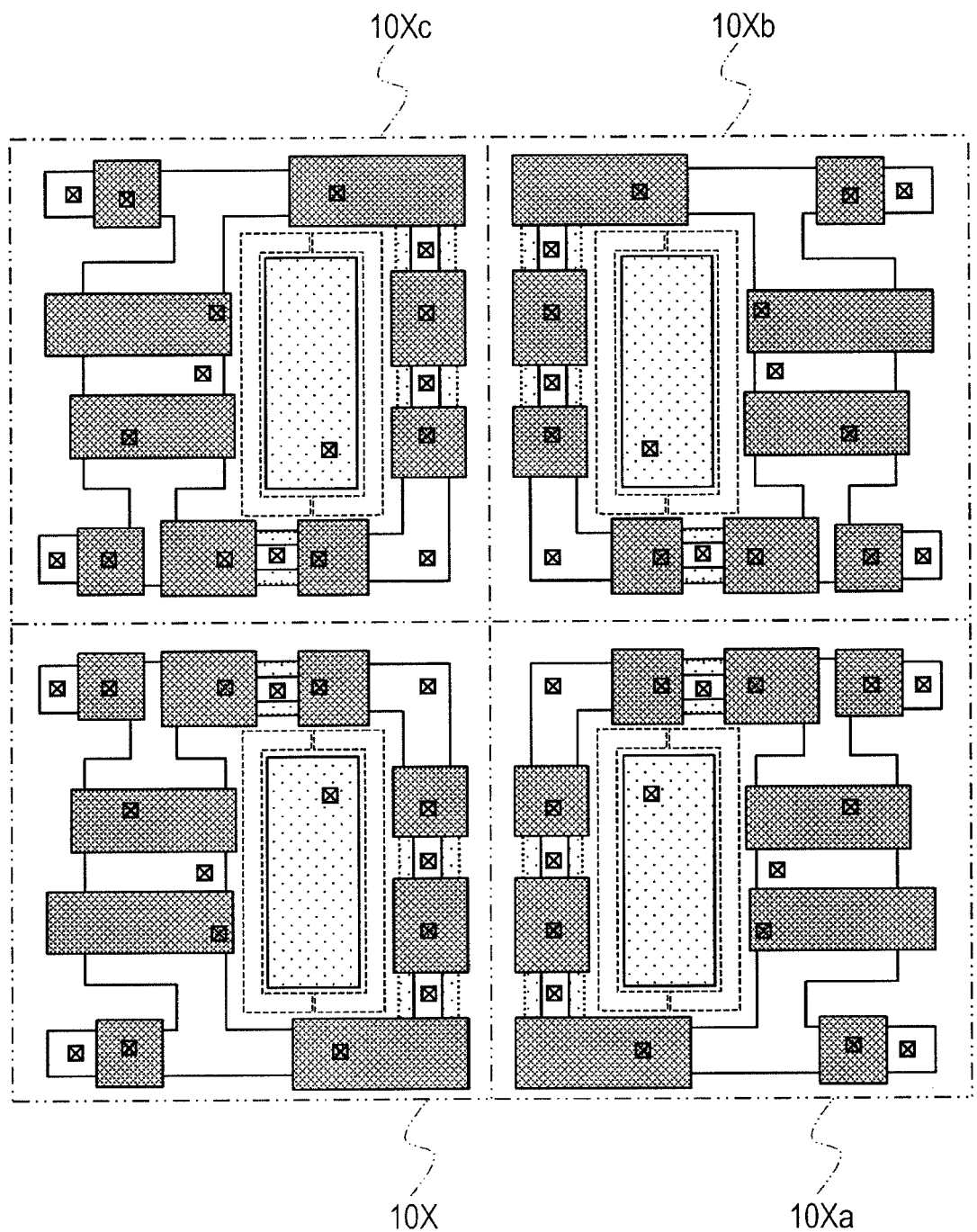
FIG. 15 is a schematic plan view illustrating an example of a two-dimensional array of the fourth pixels illustrated in FIG. 13.

FIG. 14 illustrates an example of the layout of the elements in the pixel 10X illustrated in FIG. 13, and FIG. 15 illustrates an example of a two-dimensional array of the pixel 10X illustrated in FIG. 13. In FIGS. 14 and 15, dotted lines indicate the general positions of impurity regions 69*pa* and impurity regions 69*pb*.

Of the four pixels illustrated in FIG. 15, a pixel 10Xa located to the lower right has a structure of a mirror image of the pixel 10X on a virtual axis passing through the center of the pixel 10X and extending parallel to the column direction of the multiple pixels. Of the four pixels illustrated in FIG. 15, a pixel 10Xb located to the upper right and a pixel 10Xc located to the upper left have a structure of a mirror image of the pixel 10X and pixel 10Xa on a virtual axis passing through the center of the pixel 10X and extending parallel to the row direction of the multiple pixels. In the fourth modification, the imaging region R1 can be formed from a repetition where a group of these four pixels 10X and 10Xa through 10Xc are an increment.

In the example illustrated in FIG. 14, the blocking structure 28B is disposed at the general middle of the pixel 10X, and the signal detection circuits 14Xa and 14Xb are disposed in the pixel 10X surrounding the blocking structure 28B. In this example, multiple n-type impurity regions including such as the n-type impurity region 68*bn* are located on the periphery of the impurity region 69*n* of the blocking structure 28B. Accordingly, the impurity region 69*pa* and impurity region 69*pb* of the blocking structure 28B are provided in the pixel 10X surrounding the impurity region 69*n* here. Although two regions are illustrated in FIG. 14 as if a boundary exists between the impurity region 69*pa* and the impurity region 69*pb*, the impurity region 69*pa* and impurity region 69*pb* are part of the pixel isolation region 69, and no such clear boundary exists therebetween, as described above.

The impurity region 69*pa* and impurity region 69*pb* of the blocking structure 28B is located between the n-type impurity region 68*bn* and the n-type impurity region 67*n* serving as the signal detection circuit 14Xa side charge accumulation region in this example, as schematically illustrated in FIG. 14. Accordingly, inflow of excess charges from the n-type impurity region 68*bn* to the n-type impurity region 67*n* of the signal detection circuit 14Xa can be suppressed by the blocking structure 28B. Placing the blocking structure 28B or blocking structure 28A so as to be interposed between the n-type impurity region 67*n* of the signal detection circuit 14Xa at the high-sensitivity side where demand for noise suppression is relatively strict, and the n-type impurity region 68*bn*, enables deterioration in image quality due to leak current to be effectively suppressed. It can be understood from FIG. 14 that while the feedback lines 53*a* and 53*b* are illustrated in the form of lines in FIG. 13, the structure to electrically connect the source of the signal detecting transistor 22 to the bandwidth control transistor 56 and the structure to electrically connect the source of the signal detecting transistor 22*b* to the reset transistor 26*b* are not restricted to the form of lines.

Second Embodiment

FIG. 16A schematically illustrates an exemplary device structure of a pixel 10E that an imaging device according to a second embodiment of the present disclosure has. The primary point of difference between the pixel 10A described with reference to FIG. 3A and the pixel 10E illustrated in FIG. 16A is that the pixel 10E has a blocking structure 28E instead of the blocking structure 28A. Note that in this example, the pixel 10E has a semiconductor substrate 60B instead of the semiconductor substrate 60A in comparison with the pixel 10A.

In comparison with the blocking structure 28A illustrated in FIG. 3A, the blocking structure 28E illustrated in FIG. 16A has, instead of the impurity region 69*n*, impurity region 69*pa*, and impurity region 69*pb*, an impurity region 69*p*, and a p-type impurity region 69*b* located in the impurity region 69*p*, between the n-type impurity region 68*bn* and n-type impurity region 67*n*. The impurity region 69*p* here is part of the pixel isolation region 69, and typically is provided in the p-type semiconductor layer 65*p* in the form of a p-type diffusion region. In this example, the n-type impurity region 68*bn* and the n-type impurity region 67*n* are also located in the p-type semiconductor layer 65*p*, as illustrated in FIG. 16A.

The impurity region 69*b* located in the impurity region 69*p* is a p-type diffusion region, and has a concentration of impurity that is higher than the impurity region 69*p* by an order of around one digit. The concentration of impurity of the impurity region 69*b* may be around $3 \times 10^{19}$ cm$^{-3}$ for example. At least part of the impurity region 69*b* in the blocking structure 28E is located on the surface of the semiconductor substrate 60B, in the same way as the impurity region 69*n* in the blocking structure 28A.

The element layout when viewing the pixel 10E from the normal direction of the semiconductor substrate 60B may be the same as the element layout exemplified in FIG. 10, with the blocking structure 28B replaced by the blocking structure 28E. That is to say, at least part of the impurity region 69*b* where the concentration of p-type impurity has been made relatively high is located between the n-type impurity region 68*bn* serving as the drain region of the signal detecting transistor 22 and the n-type impurity region 67*n* serving as the charge accumulation region.

In the first embodiment described above, the blocking structure is formed by the impurity region 69*n* having the same conductivity type as the conductivity type of the gate electrode of the transistor making up the signal detection circuit. Conversely, the blocking structure 28E is formed by the p-type impurity region 69b having a conductivity type that is of inverse polarity as the gate electrode of the transistor. In this way, the same effects as those of the blocking structure 28A in the first embodiment can be obtained by an arrangement where a impurity region 69p, for example, is disposed between the n-type impurity region 68bn and the n-type impurity region 67n serving as a charge accumulation region, and the impurity region 69b having an even higher concentration of impurity is formed in the impurity region 69p.

Note that in the blocking structure 28A according to the first embodiment, the impurity region 69pa and impurity region 69pb of different conductivity type from the impurity region 69n are disposed in the semiconductor substrate 60A so as to sandwich the impurity region 69n therebetween. That is to say, no p-type impurity region having relatively high concentration of impurity is disposed below the impurity region 69n. In comparison with this, in the blocking structure 28E illustrated in FIG. 16A, the impurity region 69b is surrounded by the impurity region 69p having relatively high concentration of impurity. According to this arrangement, minority carriers can be suppressed from passing around from below the impurity region 69b, and the number of minority carriers arriving at the n-type impurity region 67n serving as the charge accumulation region can be suppressed, as compared to a case where an n-type impurity region is disposed sandwiching the impurity region 69b.

By forming the impurity region 69b having relatively high concentration of impurity between the n-type impurity region 68bn and the n-type impurity region 67n, electrons generated at the n-type impurity region 68bn and heading toward the n-type impurity region 67n can be eliminated at the position of the impurity region 69b by recombination with majority carriers. That is to say, contamination of the n-type impurity region 67n by excess charges from the n-type impurity region 68bn can be suppressed, yielding an effect of suppressing leak current. The blocking structure is formed by placing a region that has common conductivity type and relatively high concentration of impurity in the p-type impurity region 69p, instead of forming the blocking structure by placing an n-type impurity region with relatively high concentration of impurity, between two p-type impurity regions disposed apart from each other. Accordingly, the number of p-n junctions in the semiconductor substrate 60B can be reduced. Effects of reduction in occurrence of charges that are the cause of leak current are anticipated.

Modifications

Figure 16B:
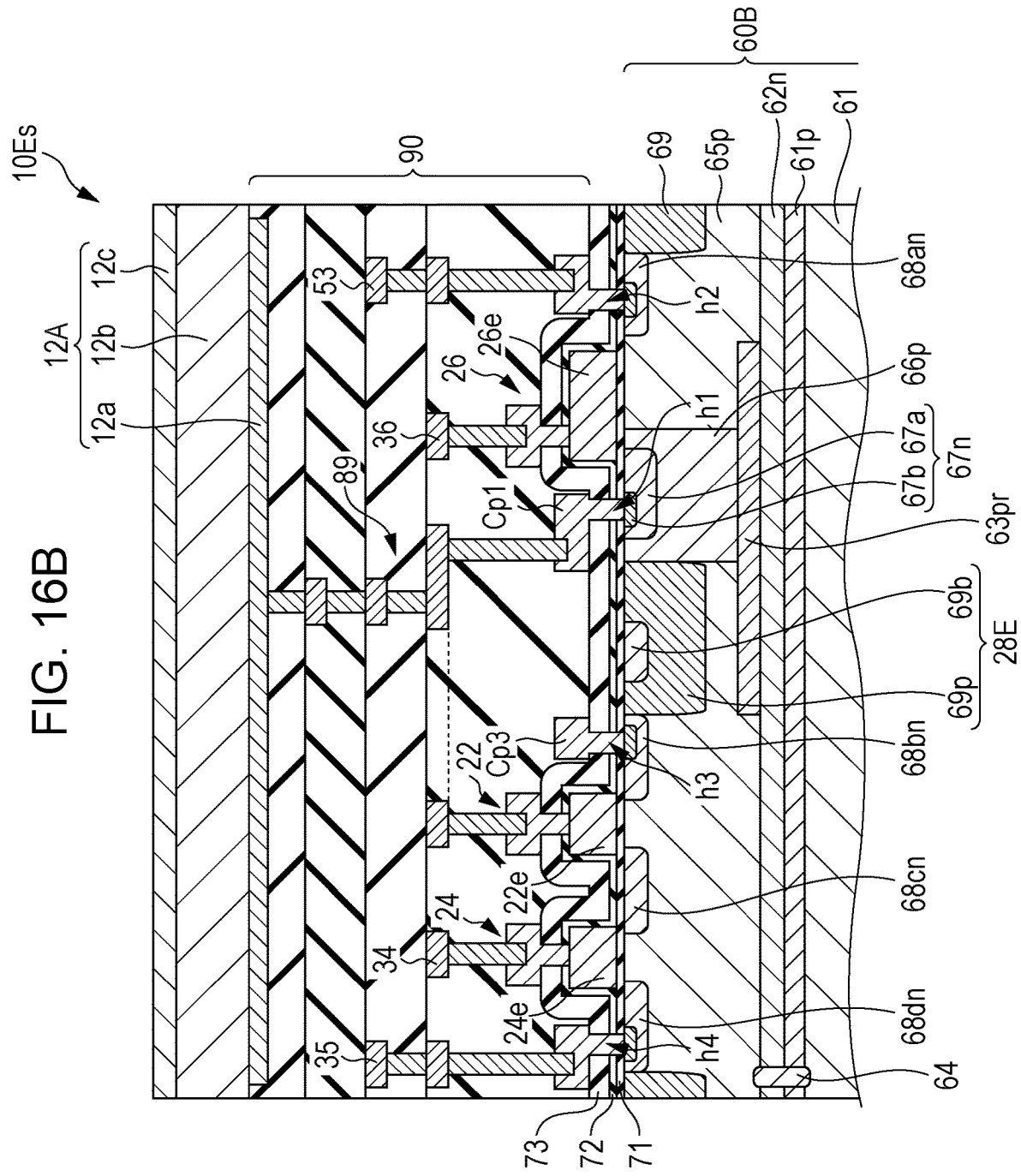
FIG. 16B is a cross-sectional view schematically illustrating the device structure of a pixel that the imaging device according to a first modification of the second embodiment of the present disclosure has.

FIG. 16B schematically illustrates the device structure of a pixel that the imaging device according to a first modification of the second embodiment has. In a pixel 10Es exemplified in FIG. 16B, the semiconductor substrate 60B has a p-type impurity region 63pr on the n-type semiconductor layer 62n. The concentration of impurity of the p-type impurity region 63pr is higher than that of the p-type semiconductor layer 65p, and may be around $3\times10^{18}$ cm$^{-3}$ or higher, for example. In this example, the p-type impurity region 63pr is selectively formed at a region overlapping the blocking structure 28E and the n-type impurity region 67n serving as a charge accumulation region in the semiconductor substrate 60B, in plan view.

The p-type impurity region 63pr typically does not exist directly beneath the n-type impurity region 68bn, as schematically illustrated in FIG. 16B. According to studies made by the present inventors, disposing the p-type impurity region 63pr avoiding the region of the semiconductor substrate 60B that overlaps the n-type impurity region 68bn in plan view tends to result in the n-type semiconductor layer 62n directly beneath the n-type impurity region 68bn spreading toward the n-type impurity region 68bn. If the boundary between the n-type semiconductor layer 62n and p-type semiconductor layer 65p come near to the n-type impurity region 68bn, electrons occurring at the p-n junction between the n-type impurity region 68bn and the surroundings thereof more readily move to the n-type semiconductor layer 62n. As a result, the number of minority carriers moving from the n-type impurity region 68bn toward the n-type impurity region 67n decreases, and the effects of leak current suppression can be obtained.

In the configuration exemplified in FIG. 16B, the p-type impurity region 63pr does not exist directly below the n-type impurity region 68an either. Placing the p-type impurity region 63pr avoiding a region overlapping the n-type impurity region 68an in plan view enables the n-type semiconductor layer 62n to expand toward the n-type impurity region 68an directly below the n-type impurity region 68an. Accordingly, effects of suppressing contamination of the n-type impurity region 67n by electrons generated at the p-n junction between the n-type impurity region 68an and the surroundings thereof can be obtained, in the same way as the case of forming the p-type impurity region 63pr avoiding directly below the n-type impurity region 68bn. Note that the p-type impurity region 63pr exemplifies a third impurity region.

FIG. 17 schematically illustrates the device structure of a pixel that the imaging device according to a second modification of the second embodiment has. A pixel 10 OF illustrated in FIG. 17 has a blocking structure 28F instead of the blocking structure 28E, in comparison with the pixel 10Es illustrated in FIG. 16B. The blocking structure 28F further includes the contact plug Cp8 connected to the impurity region 69b, as illustrated in FIG. 17. The contact plug Cp8 here is a polysilicon plug that has been imparted conductivity by being doped by a p-type impurity. The contact plug Cp8 is connected to the voltage line 38, in the same way as the example described with reference to FIG. 5. The voltage line 38 has no electrical connection with any of the address signal line 34, reset signal line 36, and conductive structure 89, in the same way as the examples illustrated in FIGS. 5 and 9.

Figure 18:
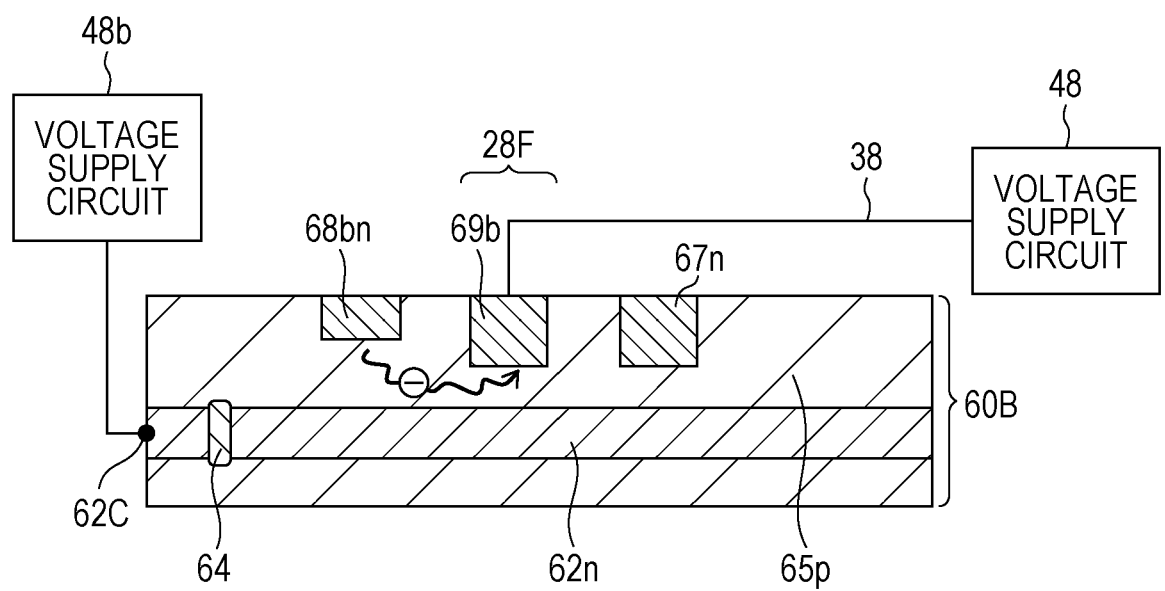
FIG. 18 is a diagram schematically illustrating an example of electrical connection between a fifth pixel and a voltage supply circuit.

FIG. 18 schematically illustrates an example of electrical connection between a pixel 10 OF and the voltage supply circuit 48. The blocking structure 28F has a configuration where a predetermined voltage can be applied to the impurity region 69b via the voltage line 38. A desired voltage can be applied to the n-type semiconductor layer 62n as well in this example, by the second voltage supply circuit 48b being connected to the well contact 62C.

When the imaging device 100A is operating, the voltage supply circuit 48 supplies voltage of 0 V, for example, to the impurity region 69b. On the other hand, voltage of 0.5 V is applied from the voltage supply circuit 48b to the n-type semiconductor layer 62n. That is to say, the potential of the impurity region 69b and the potential of the n-type semiconductor layer 62n can be independently controlled. In the configuration exemplified in FIG. 18, the predetermined voltage of 0 V, for example, is directly applied to the p-type impurity region 69b by the voltage line 38 having been connected to the impurity region 69b, but an arrangement may be made where the voltage line 38 is connected to the above-described substrate contact 61C, and voltage is applied to the impurity region 69b via the supporting substrate 61, p-type region 64, p-type semiconductor layer 65p, and impurity region 69p. Note however, that the arrangement where the voltage line 38 is connected to the impurity region 69b without going through the p-type semiconductor layer 65p and so forth, as illustrated in FIG. 18, is more advantageous in that voltage can be supplied to the impurity region 69b while removing the effects of resistance components from the substrate contact 61C up to the impurity region 69b.

Further, voltage applied to the p-type impurity region 69b may be supplied in common to the impurity region 69p via the substrate contact 61C. Fixing the potential of the impurity regions 69p and 69b by applying voltage from outside of the pixel 10F can suppress contamination of the n-type impurity region 67n by minority carriers even more effectively. Application of voltage to the impurity regions 69p and 69b may be executed by a single voltage supply circuit, e.g., the voltage supply circuit 48. Application of voltage does not have to be executed perpetually, and it is sufficient to be selectively executed in charge accumulation periods.

Note that in the configuration exemplified in FIG. 17, a predetermined voltage is applied from the voltage line 38 to the impurity region 69b via the contact plug Cp8, but an arrangement may be made where the contact plug Cp8 is omitted and a metal line is connected to the impurity region 69b. In this case, it is advantageous for the impurity region 69b to have a concentration of impurity around $3 \times 10^{19}$ cm$^{-3}$ or higher, for example.

Third Embodiment

Figure 19:
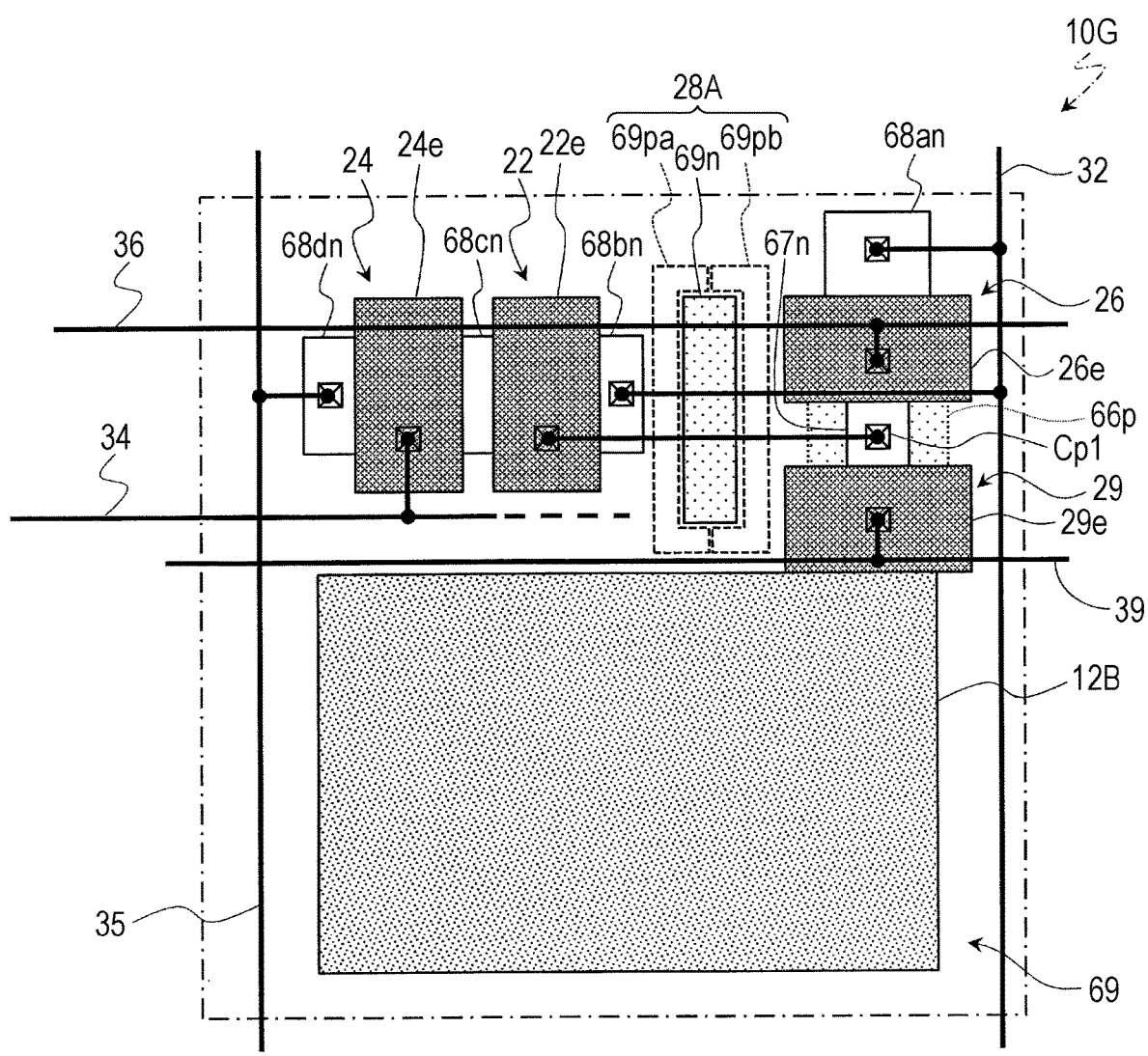
FIG. 19 is a schematic plan view illustrating an example of a layout of elements in a sixth pixel that an imaging device according to a third embodiment of the present disclosure has.
Figure 20:
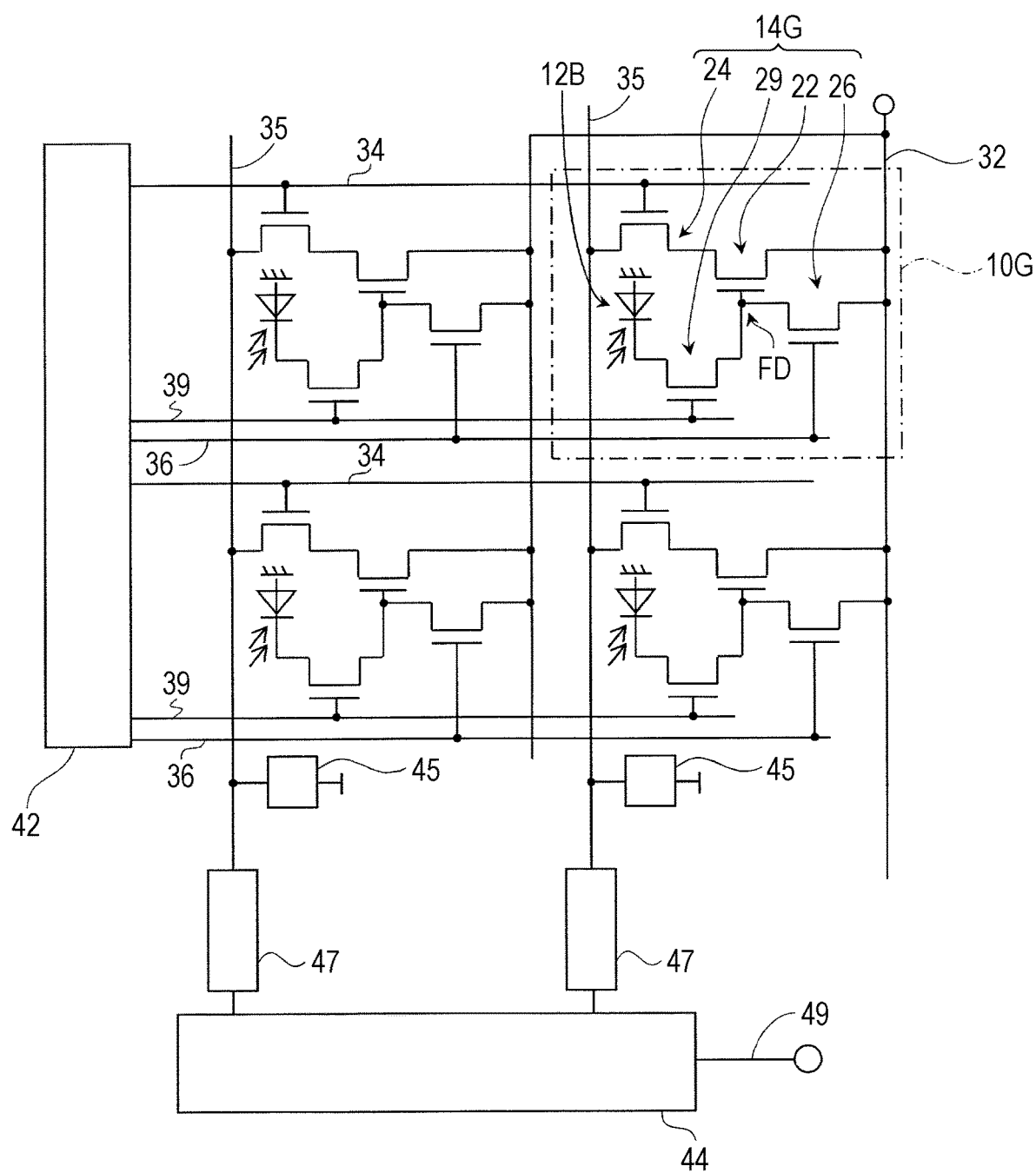
FIG. 20 is a diagram illustrating an exemplary circuit configuration of the sixth pixel illustrated in FIG. 19.

FIGS. 19 and 20 illustrate an imaging device according to a third embodiment of the present disclosure. FIG. 19 illustrates an example of the layout of elements in a pixel 10G that the imaging device according to the third embodiment has, and FIG. 20 illustrates an exemplary circuit configuration of the pixel 10G illustrated in FIG. 19.

The pixel 10G illustrated in FIGS. 19 and 20 has a photodiode 12B as the photoelectric converter 12. In a case of applying the photodiode 12B instead of the photoelectric conversion structure 12A, the accumulation control line 31 illustrated in FIG. 2 is omitted. The point of one of the drain and source of the reset transistor 26 being connected to the charge accumulation node FD is the same as the configuration illustrated in FIG. 2. Note however, that the power source wiring 32 is connected to the other of the drain and source of the reset transistor 26 here.

The pixel 10G includes a signal detection circuit 14G connected to the photodiode 12B. The signal detection circuit 14G further includes a transfer transistor 29, which is connected between the gate of the signal detecting transistor 22 and the photodiode 12B, as compared to the signal detection circuit 14A of the above-described pixel 10A. A transfer signal line 39 is connected to a gate electrode 29e of the transfer transistor 29. The transfer signal line 39 has connection with the vertical scanning circuit 42 for example, and the potential thereof is controlled by the vertical scanning circuit 42. The vertical scanning circuit 42 can control the timing of transferring signal charges generated at the photodiode 12B to the charge accumulation node FD, by on and off control of the transfer transistor 29.

In this example, the charge accumulation node FD is a node where the gate electrode 22e of the signal detecting transistor 22 connects to the photodiode 12B. The charge accumulation node FD includes as part thereof the n-type impurity region 67n formed on the semiconductor substrate 60A, in the same way as the examples described above. In the configuration exemplified in FIG. 19, the p-type impurity region 66p with relatively low concentration of impurity is located between the gate electrodes 26e and 29e in plan view. The n-type impurity region 67n is located in the p-type impurity region 66p.

The blocking structure 28A is disposed between the n-type impurity region 67n and the n-type impurity region 68bn in the example illustrated in FIG. 19 as well. Accordingly, the unwanted minority carriers moving toward the n-type impurity region 67n can be suppressed from contaminating the n-type impurity region 67n by the blocking structure 28A. In this example, the impurity region 69pa and the impurity region 69pb of the blocking structure 28A are provided in the pixel 10G surrounding the impurity region 69n, in the same way as in the example described referencing FIGS. 14 and 15. It is needless to say that any of the above-described blocking structures 28B, 28E, and 28F may be applied instead of the blocking structure 28A.

EXAMPLES

The effects of suppressing leak current by providing the blocking structure in a pixel were verified by simulation. A general commercially-available device simulator was used for the simulation.

Figure 21:
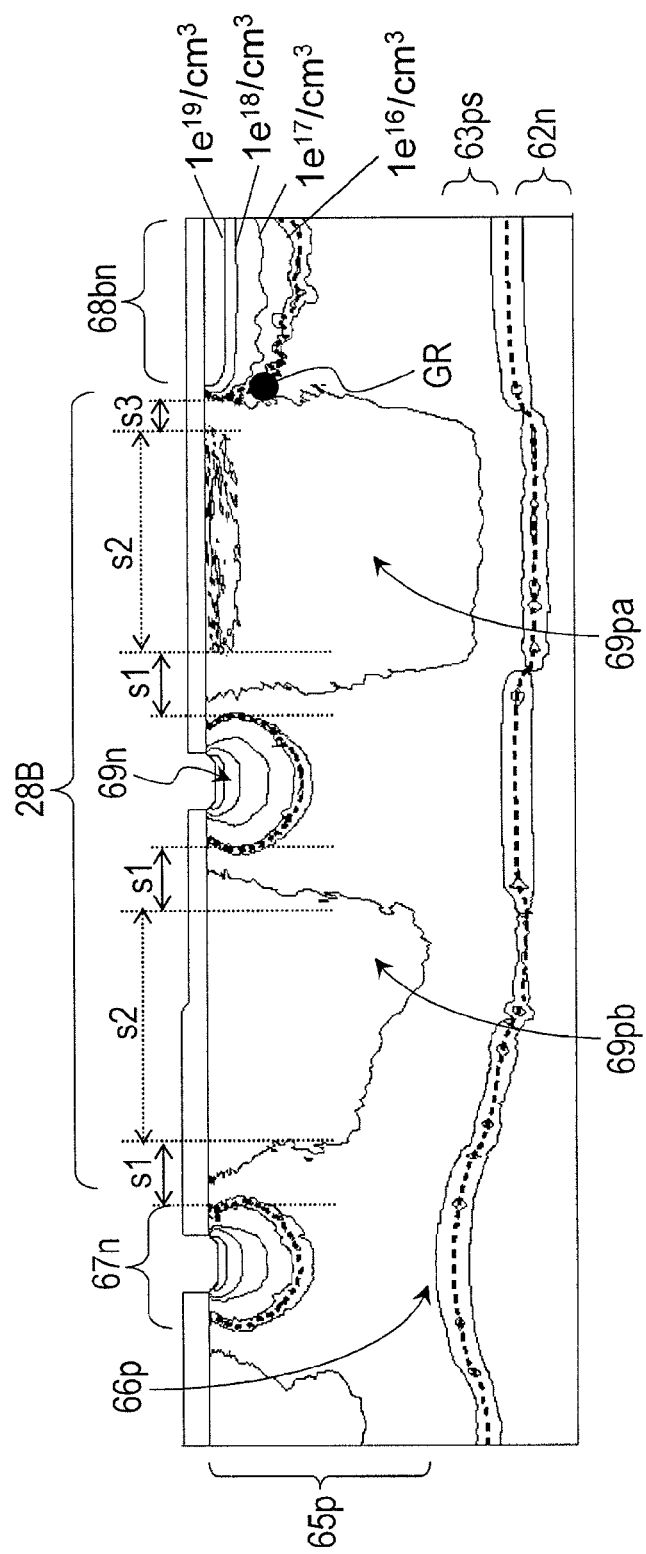
FIG. 21 is a schematic diagram for describing a model used for simulation.

FIG. 21 schematically illustrates a model used for simulation. The distribution of concentration of n-type impurities is also illustrated in FIG. 21. The magnitude of the leak current was evaluated by assuming a structure the same as that of the pixel 10B illustrated in FIG. 5, and calculating what percentage of electrons generated at the position indicated by the black dot GR in FIG. 21 would reach the n-type impurity region 67n. The heavy dashed line in FIG. 21 represents the position of the p-n junction, and the distance indicated by double-headed arrow s1, the distance indicated by double-headed arrow s2, and the distance indicated by double-headed arrow s3, were set to 90 nm, 390 nm, and 50 nm, respectively. The potential of the n-type impurity region 67n and n-type impurity region 68bn are fixed to 0.5 V and 3.3 V, respectively. Analysis was performed assuming a state where voltage of 0.5 V is applied to the blocking structure 28B and n-type semiconductor layer 62n.

First Example

Figure 22:
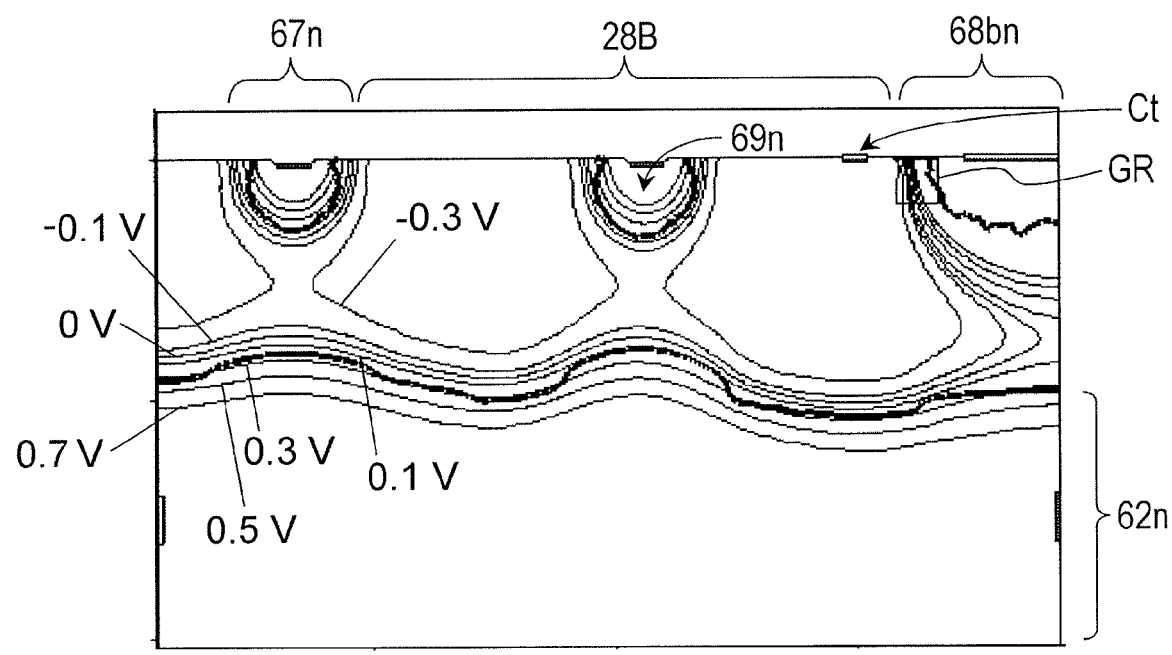
FIG. 22 is a diagram illustrating simulation results relating to a first example assuming basically the same structure as the fifth pixel illustrated in FIG. 5, illustrating calculation results regarding potential at each portion.
Figure 23:
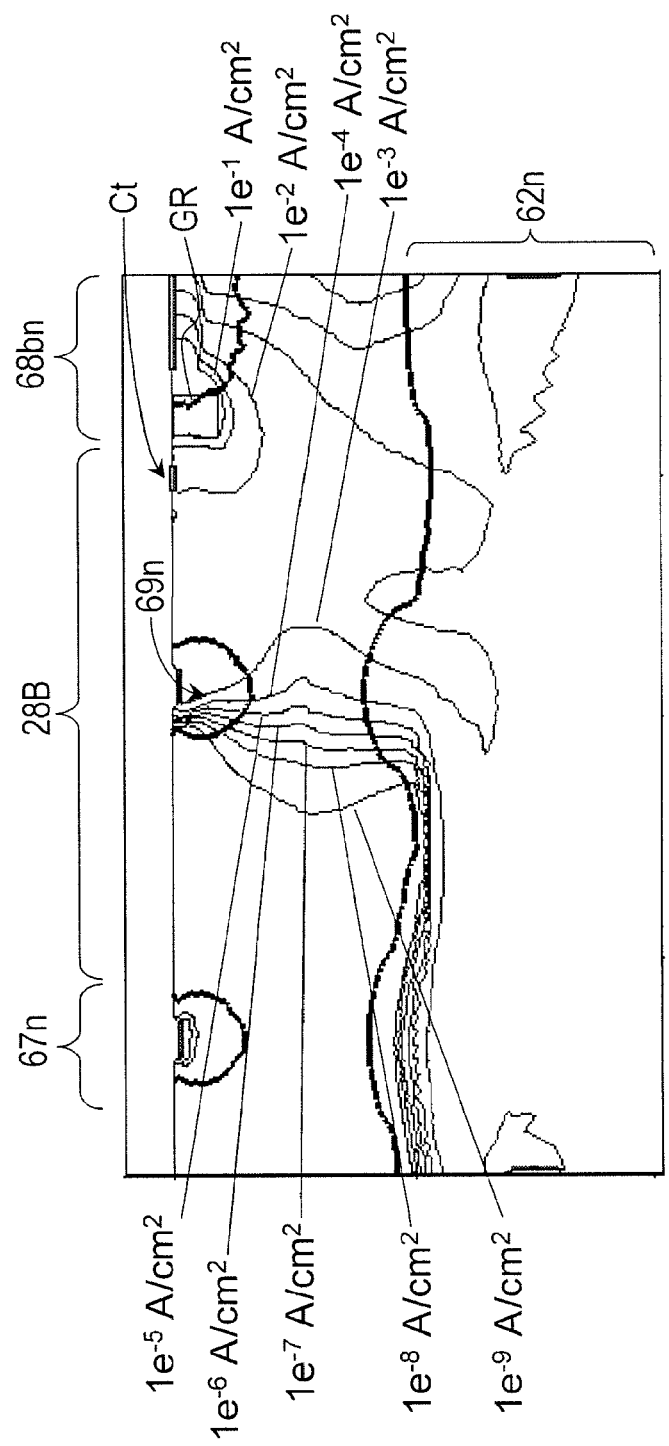
FIG. 23 is a diagram illustrating simulation results relating to the first example assuming basically the same structure as the fifth pixel illustrated in FIG. 5, illustrating calculation results regarding current density at each portion.

FIGS. 22 and 23 illustrate simulation results relating to a first example assuming basically the same structure as that of the pixel 10B illustrated in FIG. 5. FIG. 22 indicates the calculation results relating to potential at each part, and FIG. 23 illustrates the calculation results relating to current density at each part. Hereinafter, in the drawings, the heavy solid line indicates the position of the p-n junction, and the rectangle Ct indicates the position of a substrate contact.

Second Example

Figure 24:
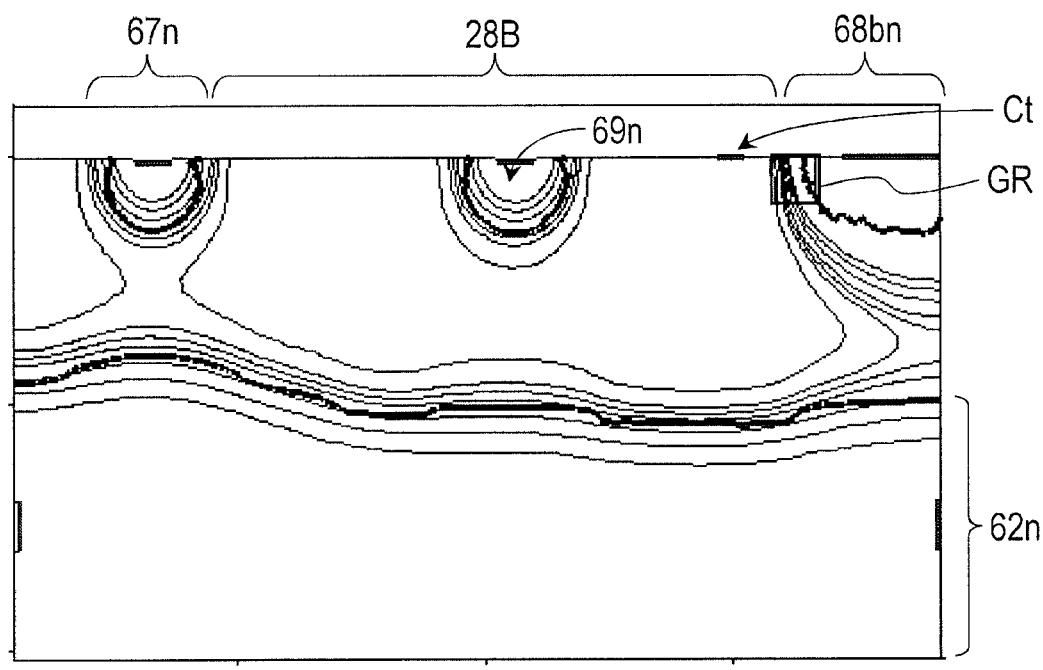
FIG. 24 is a diagram illustrating calculation results relating to potential at each portion in a sample of a second example.
Figure 25:
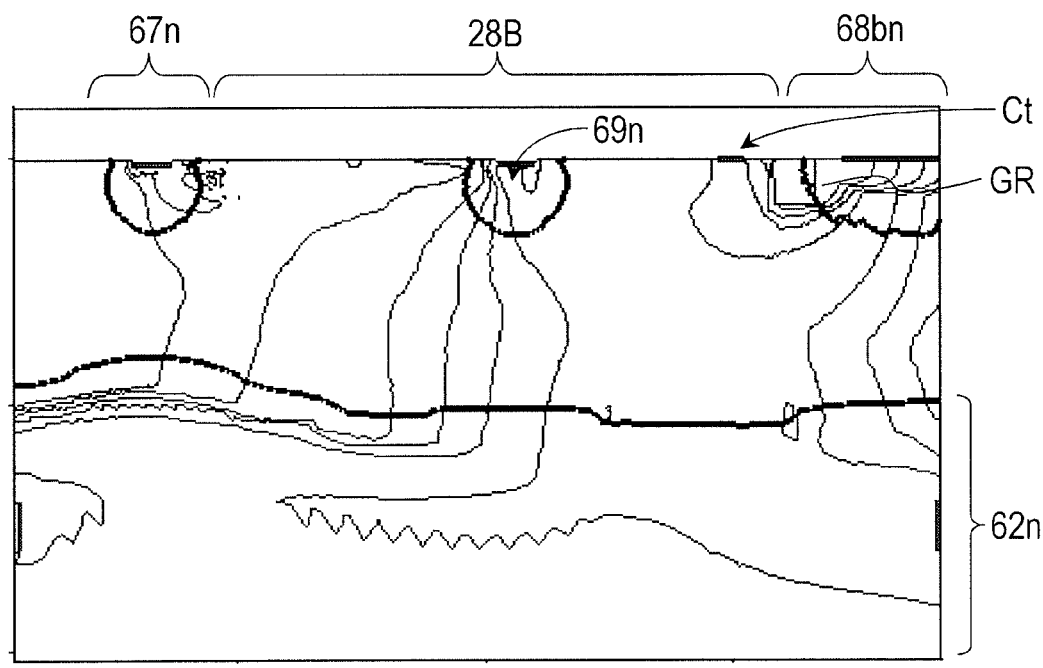
FIG. 25 is a diagram illustrating calculation results relating to current density at each portion in a sample of the second example.

Next, analysis was performed assuming, as a sample for a second example, a configuration where the p-type semiconductor layer 63p covers almost the entire face of the n-type semiconductor layer 62n as in the example described with reference to FIG. 3A, i.e., a configuration where the p-type semiconductor layer 63p is disposed instead of the p-type semiconductor layer 63ps having an opening directly beneath the impurity region 69n. FIG. 24 indicates the calculation results relating to potential at each part of the sample for the second example, and FIG. 25 illustrates the calculation results for current density at each part of the sample for the second example.

First Comparative Example

Figure 26:
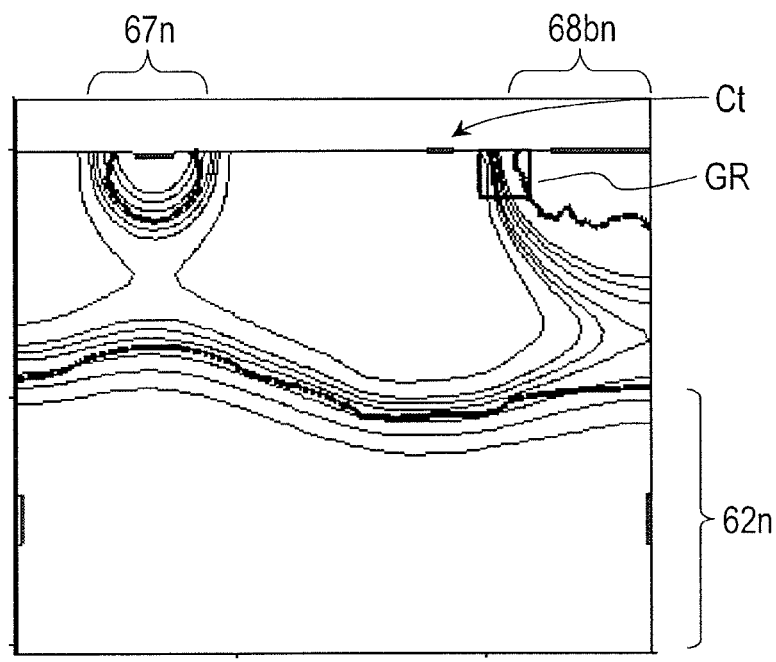
FIG. 26 is a diagram illustrating calculation results relating to potential at each portion in a sample of a first comparative example.
Figure 27:
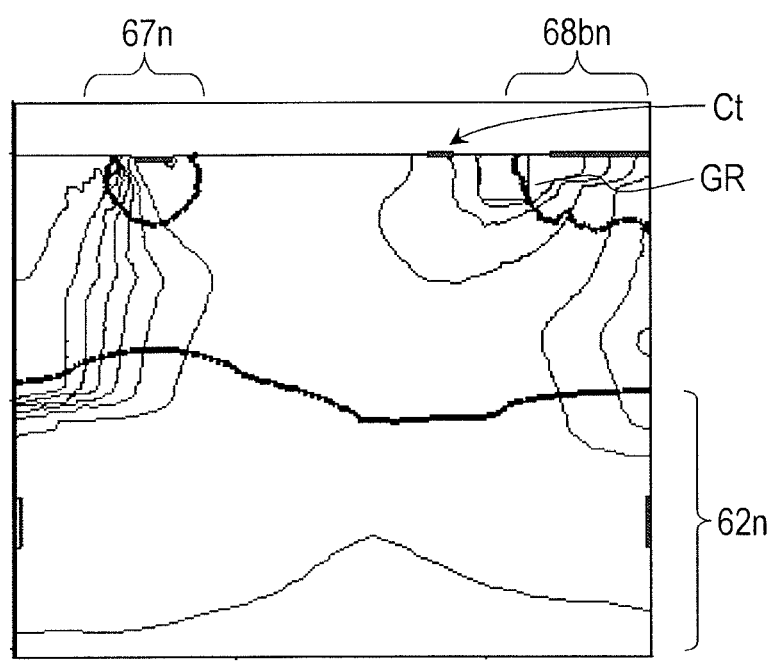
FIG. 27 is a diagram illustrating calculation results relating to current density at each portion in a sample of the first comparative example.

Next, a configuration where the blocking structure 28B was removed from the sample of the second example was assumed as a sample for a first comparative example, and analysis was performed. FIG. 26 indicates the calculation results relating to potential at each part of the sample for the first comparative example, and FIG. 27 illustrates the calculation results relating to current density at each part of the sample for the first comparative example.

Figure 28:
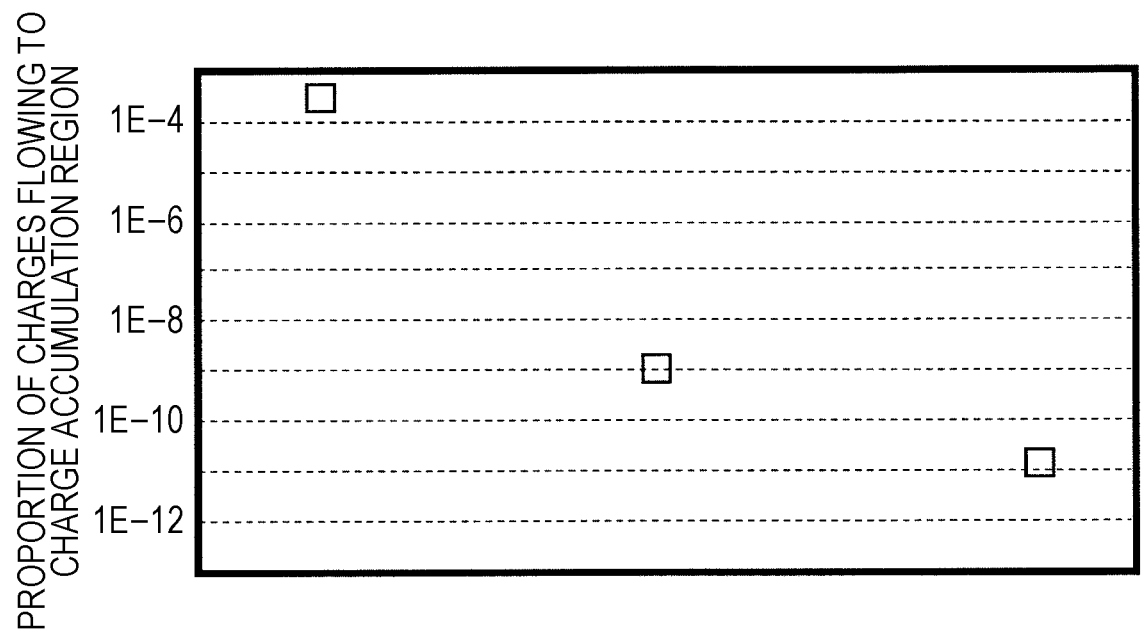
FIG. 28 is a diagram illustrating calculation results regarding the proportion of charge flowing into a charge accumulation region, out of charges generated nearby an n-type impurity region.

FIG. 28 illustrates calculation results of the percentage of inflow of charges to the n-type impurity region 67n out of the charges generated near the n-type impurity region 68bn. In FIG. 28, the calculation results relating to the first example are plotted to the far right, and the calculation results relating to the second example are plotted at the middle. The calculation results relating to the first comparative example are plotted to the far left in FIG. 28.

It can be seen from the calculation results relating to the first and second examples and the calculation results relating to the first comparative example in FIG. 28 that the leak current can be reduced by an order of around five digits by providing the blocking structure in the pixel. Also, comparing the calculation results relating to the first example and the calculation results relating to the second example shows that in particular, providing an opening in the p-type semiconductor layer 63ps and disposing the p-type impurity region 66p with relatively low concentration of impurity in the opening, as in the pixel 10B illustrated in FIG. 5, enables the leak current to be further reduced by an order of around two digits.

Figure 29:
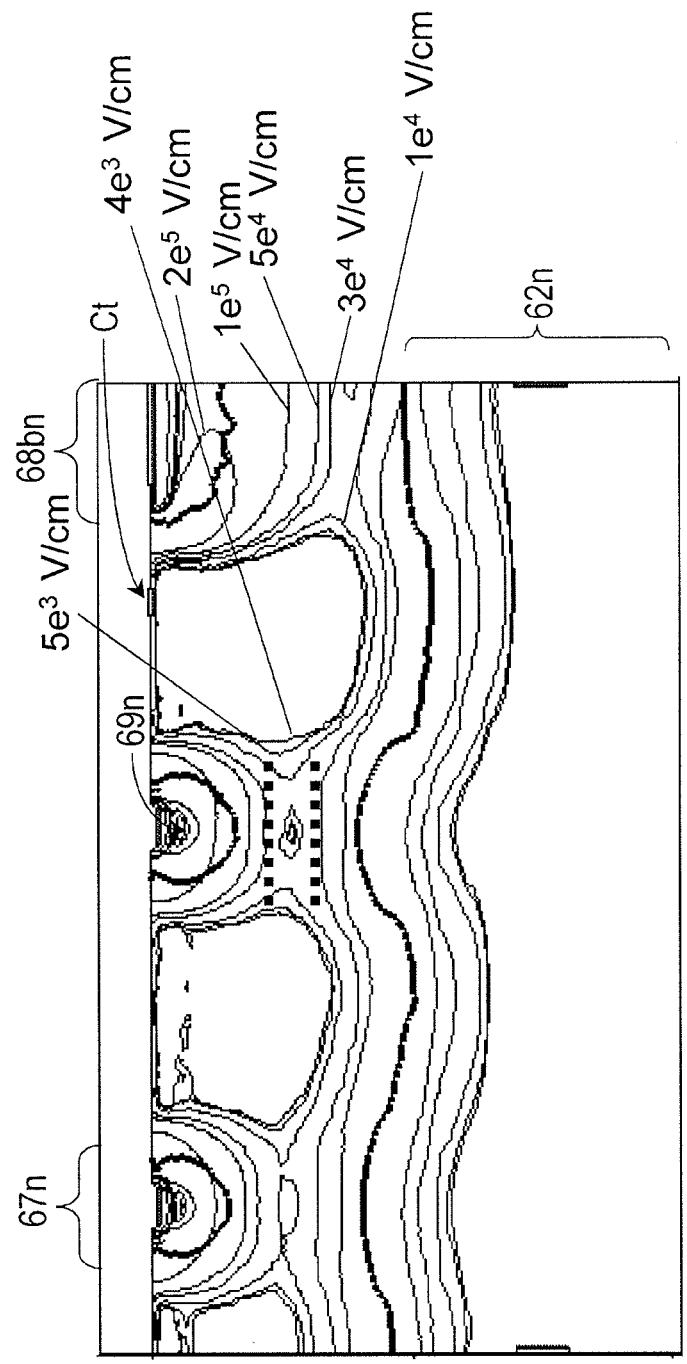
FIG. 29 is a diagram illustrating calculation results relating to electric field at each portion in a sample of the first example.

Next, the effects of reduced leak current by placing the p-type impurity region 66p directly below the impurity region 69n making up the blocking structure 28B were verified by calculating the magnitude of electric field at each part with regard to the samples of the first example and second example. FIG. 29 illustrates calculation results relating to the electric field at each part of the sample in the first example, and FIG. 30 illustrates calculation results relating to the electric field at each part of the sample in the second example.

Figure 30:
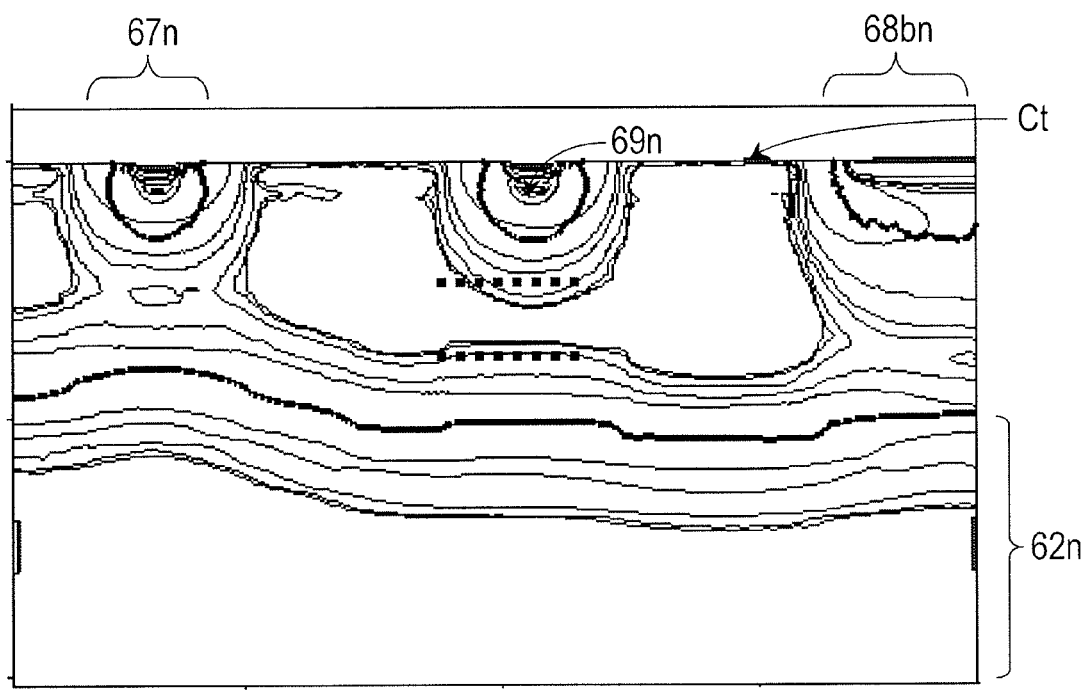
FIG. 30 is a diagram illustrating calculation results relating to electric field at each portion in a sample of the second example.

Looking closely at the region between the impurity region 69n, and the portion of the n-type semiconductor layer 62n that is located directly beneath the impurity region 69n, it can be seen from comparing FIGS. 29 and 30 that the p-n junction at the boundary between the n-type semiconductor layer 62n and the upper layer thereof is generally flat in the sample according to the second example, while the p-n junction between the n-type semiconductor layer 62n and the upper layer thereof bulges upwards toward the impurity region 69n directly beneath the impurity region 69n in the sample according to the first example. Accordingly, while there is a relatively large region where the electric field is small, directly beneath the impurity region 69n in the sample in the second example, as indicated by the heavy dotted lines in FIG. 30, the distance between these heavy dotted lines is narrow in the sample in the first example.

This suggests that the path of movement of charges heading from the n-type impurity region 68bn toward the n-type impurity region 67n is narrowed directly beneath the impurity region 69n in the sample in the second example. That is to say, by selectively lowering the concentration of impurity at the portion of the p-type semiconductor layer 63ps located directly beneath the impurity region 69n narrows the path of movement of charges between the n-type impurity region 68bn and n-type impurity region 67n. Accordingly, charges generated at the n-type impurity region 68bn and the periphery thereof that move through the semiconductor substrate advance toward the impurity region 69n or the n-type semiconductor layer 62n following the potential gradient, and are absorbed at the impurity region 69n or n-type semiconductor layer 62n. That is to say, inflow of unwanted minority carriers to the n-type impurity region 67n is blocked at the position of the impurity region 69n, so unwanted current less readily flows into the n-type impurity region 67n serving as the charge accumulation region, and effects of suppressed leak current can be obtained.

As described above, according to embodiments of the present disclosure, the effects of leak current can be suppressed, and accordingly an imaging device capable of imaging with high image quality can be provided. Note that the conductivity types of impurity regions in the semiconductor substrate are not restricted to the arrangements in the above-described examples, and that configurations may be made where n-type and p-type are inverted. Also note that the transistors described above, such as the signal detecting transistor 22, address transistor 24, reset transistor 26, and so forth, may be N-channel MOS devices or may be p-channel MOS devices. These transistors do not have to be all N-channel MOS devices or all p-channel MOS devices. In a case of using N-channel MOS devices for the transistors in the pixel, and using electrons as the signal charge, it is sufficient to invert the layout of sources and drains of the transistors.

According to embodiments of the present disclosure, an imaging device that can suppress effects of leak current and take high quality images is provided. The imaging device according to the present disclosure is useful in, for example, image sensors, digital cameras, and so forth. The imaging device according to the present disclosure can be used in medical cameras, robotic cameras, security cameras, cameras installed in vehicles and used, and so forth.

What is claimed is:

1. An imaging device, comprising:
   a photoelectric converter that generates a signal charge by photoelectric conversion of light;
   a semiconductor substrate that includes a first semiconductor layer containing an impurity of a first conductivity type and an impurity of a second conductivity type different from the first conductivity type; and
   a first transistor that includes, as a source or a drain, a first impurity region of the second conductivity type in the first semiconductor layer, wherein
   the first semiconductor layer includes:
      a charge accumulation region that is an impurity region of the second conductivity type, the charge accumulation region being configured to accumulate the signal charge; and
      a blocking structure that is located between the charge accumulation region and the first transistor,
   the blocking structure includes:
      a second impurity region of the first conductivity type,
      a third impurity region of the second conductivity type, and
      a fourth impurity region of the first conductivity type, and
   at a surface of the first semiconductor layer, the second impurity region, the third impurity region, and the fourth impurity region, are arranged in that order in a first direction from the first impurity region toward the charge accumulation region.

2. The imaging device according to claim 1, wherein
the semiconductor substrate includes
   a supporting substrate including an impurity of the first conductivity type, and
   a second semiconductor layer that is located between the supporting substrate and the first semiconductor layer, the second semiconductor layer including an impurity of the second conductivity type.

3. The imaging device according to claim 2, wherein
the semiconductor substrate further includes a third semiconductor layer that is located between the first semiconductor layer and the second semiconductor layer, the third semiconductor layer including an impurity of the first conductivity type,
the third semiconductor layer has an opening that overlaps the third impurity region in a plan view, and
a concentration of impurity of the first conductivity type in a region located in the opening is lower than a concentration of impurity of the first conductivity type in the third semiconductor layer.

4. The imaging device according to claim 1, further comprising a voltage supply circuit configured to apply, to the third impurity region, a first voltage that is inverse bias with regard to the first semiconductor layer, or a second voltage that is a same voltage as the first semiconductor layer, in a period in which the signal charge is accumulated in the charge accumulation region.

5. The imaging device according to claim 4, wherein a third voltage that is different from the first voltage, or the second voltage that is 0 V, is applied to the second impurity region and the fourth impurity region via the first semiconductor layer, in the period.

6. The imaging device according to claim 5, wherein the third voltage is less than the first voltage.

7. The imaging device according to claim 4, wherein a same voltage is applied to the third impurity region and the second semiconductor layer in the period.

8. The imaging device according to claim 1, further comprising:
   a second transistor including the charge accumulation region as one of a source and a drain, wherein
   a same voltage is applied to the third impurity region and the other of the source and the drain of the second transistor.

9. The imaging device according to claim 1, wherein the second impurity region and the fourth impurity region are a single continuous impurity region surrounding the third impurity region.

10. An imaging device, comprising:
    a photoelectric converter that generates a signal charge by photoelectric conversion of light;
    a semiconductor substrate that includes a first semiconductor layer containing an impurity of a first conductivity type and an impurity of a second conductivity type different from the first conductivity type; and
    a first transistor that includes, as a source or a drain, a first impurity region of the second conductivity type in the first semiconductor layer, wherein
    the first semiconductor layer includes:
       a charge accumulation region that is an impurity region of the second conductivity type, the charge accumulation region being configured to accumulate the signal charge; and
       a blocking structure that is located between the charge accumulation region and the first transistor, and
    the blocking structure includes:
       a second impurity region of the first conductivity type; and
       a third impurity region of the first conductivity type, that is located in the second impurity region, a part of the third impurity region being located on a surface of the first semiconductor layer, a concentration of impurity of the first conductivity type in the third impurity region being higher than a concentration of impurity of the first conductivity type in the second impurity region.

11. The imaging device according to claim 10, wherein
the semiconductor substrate includes
   a supporting substrate including an impurity of the first conductivity type, and
   a second semiconductor layer that is located between the supporting substrate and the first semiconductor layer, the second semiconductor layer including an impurity of the second conductivity type.

12. The imaging device according to claim 11, wherein
the semiconductor substrate further includes a fourth impurity region that is located between the first semiconductor layer and the second semiconductor layer, the fourth impurity region including an impurity of the first conductivity type, and
a concentration of impurity of the first conductivity type in the fourth impurity region is higher than a concentration of impurity of the first conductivity type in the first semiconductor layer.

13. The imaging device according to claim 12, wherein the fourth impurity region does not overlap the first impurity region in a plan view.

14. The imaging device according to claim 12, further comprising:
    a second transistor including the charge accumulation region as one of a source and drain, wherein
    the fourth impurity region does not overlap the other of the source and the drain of the second transistor in a plan view.

15. The imaging device according to claim 10, further comprising: a voltage supply circuit configured to apply a first voltage to the third impurity region, in a period in which the signal charge is accumulated in the charge accumulation region.

16. The imaging device according to claim 15, wherein a same voltage as the first voltage is applied to the second impurity region via the supporting substrate.

* * * * *